United States Patent
Tanaka et al.

(10) Patent No.: US 10,047,257 B2
(45) Date of Patent: Aug. 14, 2018

(54) ADHESIVE AGENT COMPOSITION FOR MULTILAYER SEMICONDUCTOR

(71) Applicant: DAICEL CORPORATION, Osaka-shi, Osaka (JP)

(72) Inventors: Hiroki Tanaka, Himeji (JP); Katsuhiro Nakaguchi, Himeji (JP); Kiyoharu Tsutsumi, Himeji (JP); Yousuke Ito, Himeji (JP); Naoko Tsuji, Himeji (JP)

(73) Assignee: DAICEL CORPORATION, Osaka-Shi (JP)

( * ) Notice: Subject to any disclaimer, the term of this patent is extended or adjusted under 35 U.S.C. 154(b) by 0 days.

(21) Appl. No.: 15/025,143

(22) PCT Filed: Sep. 25, 2014

(86) PCT No.: PCT/JP2014/075432
§ 371 (c)(1),
(2) Date: Mar. 25, 2016

(87) PCT Pub. No.: WO2015/046333
PCT Pub. Date: Apr. 2, 2015

(65) Prior Publication Data
US 2016/0215183 A1 Jul. 28, 2016

(30) Foreign Application Priority Data

Sep. 27, 2013 (JP) .................................. 2013-201592
Apr. 10, 2014 (JP) .................................. 2014-081102

(51) Int. Cl.
*H01L 21/00* (2006.01)
*C09J 163/00* (2006.01)
(Continued)

(52) U.S. Cl.
CPC ............. *C09J 163/00* (2013.01); *C08G 59/68* (2013.01); *C09J 7/35* (2018.01); *H01L 24/83* (2013.01);
(Continued)

(58) Field of Classification Search
CPC ............. C09J 163/00; C09J 7/02; H01L 23/00
See application file for complete search history.

(56) References Cited

U.S. PATENT DOCUMENTS

| 6,451,634 B2 | 9/2002 | Ma et al. |
| 7,396,885 B2 | 7/2008 | Sato et al. |

(Continued)

FOREIGN PATENT DOCUMENTS

| CN | 1400993 A | 3/2003 |
| CN | 103262305 A | 8/2013 |

(Continued)

OTHER PUBLICATIONS

International Search Report for PCT/JP2014/075432 (PCT/ISA/210) dated Dec. 16, 2014.
(Continued)

*Primary Examiner* — Charles Garber
*Assistant Examiner* — Abdulfattah Mustapha
(74) *Attorney, Agent, or Firm* — Birch, Stewart, Kolasch & Birch, LLP

(57) ABSTRACT

Provided is an adhesive composition for multilayer semiconductors. The adhesive composition gives, when applied and dried by heating, an adhesive layer that has approximately no adhesiveness at a temperature lower than 50° C., but, when heated at such a temperature as to less cause damage to semiconductor chips, offers adhesiveness and is rapidly cured thereafter. This adhesive composition for multilayer semiconductors includes a polymerizable compound (A), at least one of a cationic-polymerization initiator (Continued)

(B1) and an anionic-polymerization initiator (B2), and a solvent (C). The polymerizable compound (A) contains 80% by weight or more of an epoxide having a softening point or melting point of 50° C. or higher. The cationic-polymerization initiator (B1) gives a composition having a thermal curing time of 3.5 minutes or longer at 130° C., where the composition contains 1 part by weight of the cationic-polymerization initiator (B1) and 100 parts by weight of 3,4-epoxycyclohexylmethyl (3,4-epoxy)cyclohexanecarboxylate. The anionic-polymerization initiator (B2) gives a composition having a thermal curing time of 3.5 minutes or longer at 130° C., where the composition contains 1 part by weight of the anionic-polymerization initiator (B2) and 100 parts by weight of bisphenol-A diglycidyl ether.

20 Claims, 2 Drawing Sheets

(51) Int. Cl.

| | | |
|---|---|---|
| *H01L 25/065* | (2006.01) | |
| *H01L 25/07* | (2006.01) | |
| *H01L 25/18* | (2006.01) | |
| *H01L 23/00* | (2006.01) | |
| *C08G 59/68* | (2006.01) | |
| *C09J 7/35* | (2018.01) | |
| *H01L 23/29* | (2006.01) | |

(52) U.S. Cl.
CPC ............ *H01L 25/065* (2013.01); *H01L 25/07* (2013.01); *H01L 25/18* (2013.01); *C09J 2203/326* (2013.01); *C09J 2463/00* (2013.01); *H01L 23/293* (2013.01); *H01L 2224/83855* (2013.01); *H01L 2924/0002* (2013.01)

(56) References Cited

U.S. PATENT DOCUMENTS

| 8,956,917 | B2 | 2/2015 | Kurosawa et al. | |
|---|---|---|---|---|
| 9,202,752 | B2 | 12/2015 | Kitada | |
| 2003/0069331 | A1 | 4/2003 | Teiichi et al. | |
| 2003/0215567 | A1 | 11/2003 | Sato et al. | |
| 2006/0194920 | A1* | 8/2006 | Capote | C08F 220/26 524/779 |
| 2007/0224393 | A1* | 9/2007 | Takeyama | C08J 7/18 428/141 |
| 2009/0258197 | A1 | 10/2009 | Hino et al. | |
| 2010/0240816 | A1* | 9/2010 | Liao | C08G 18/584 524/384 |
| 2010/0244201 | A1 | 9/2010 | Kitada | |
| 2012/0235282 | A1 | 9/2012 | Tomono et al. | |
| 2013/0260207 | A1 | 10/2013 | Uemura | |
| 2014/0171616 | A1* | 6/2014 | Hong | C08G 64/0208 528/405 |
| 2014/0225148 | A1* | 8/2014 | Hoehn | C09J 163/00 257/98 |

FOREIGN PATENT DOCUMENTS

| JP | 2000-315696 A | 11/2000 |
|---|---|---|
| JP | 2001-172364 A | 6/2001 |
| JP | 2001-237370 A | 8/2001 |
| JP | 2001-294843 A | 10/2001 |
| JP | 2002-129126 A | 5/2002 |
| JP | 2002-235065 A | 8/2002 |
| JP | 2005-12048 A | 1/2005 |
| JP | 2008-133391 A | 6/2008 |
| JP | 2008-141114 A | 6/2008 |
| JP | 2008-214449 A | 9/2008 |
| JP | 2009-120830 A | 6/2009 |
| JP | 2009-543920 A | 12/2009 |
| JP | 2010-174077 A | 8/2010 |
| JP | 2010-226060 A | 10/2010 |
| JP | 2012-164953 A | 8/2012 |
| JP | 2012-195388 A | 10/2012 |
| TW | I254722 B | 5/2006 |
| TW | 201231544 A1 | 8/2012 |
| WO | WO 01/60938 A1 | 8/2001 |
| WO | WO 2012/018123 A1 | 2/2012 |

OTHER PUBLICATIONS

Kamon et al., "Sanfukka Hoso Amine Complex Oyobi Fukka Hoso San Amine-en ni yoru Epoxy Jushi no Koka", Toronkai Koen Yoshi, Gosei Jushi Kogyo Kyokai, vol. 19, 1969, pp. 163-170.

Written Opinion of the International Searching Authority for PCT/JP2014/075432 (PCT/ISA/237) dated Dec. 16, 2014.

* cited by examiner

ADHESIVE AGENT COMPOSITION FOR MULTILAYER SEMICONDUCTOR

TECHNICAL FIELD

The present invention relates to adhesive compositions for use in stacking of semiconductor chips in the production of three-dimensional multilayer semiconductors. The application claims priority to Japanese Patent Application No. 2013-201592 filed Sep. 27, 2013 to Japan and priority to Japanese Patent Application No. 2014-081102 filed Apr. 10, 2014 to Japan, the entire contents of which are incorporated herein by reference.

BACKGROUND ART

Reduction in size and weight and increase in capacity of electronic appliances are proceeding. This requires higher degree of integration of semiconductor chips. However, mere circuit microfabrication has failed to meet the requirement sufficiently. Thus, the higher degree of integration has been achieved by vertically stacking two or more semiconductor chips.

The semiconductor chip stacking employs an adhesive (adhesive agent). A thermosetting adhesive containing benzocyclobutene (BCB) (Patent Literature (PTL) 1) is known as the adhesive. The benzocyclobutane can form a cured product having excellent heat resistance. Disadvantageously, however, heating at a high temperature of about 200° C. to 350° C. is required so as to cure (set) the BCB in a short time, and such high temperature causes the semiconductor chips to suffer from misregistration and/or damage.

CITATION LIST

Patent Literature

PTL 1: Japanese Unexamined Patent Application Publication (JP-A) No. 2010-226060

SUMMARY OF INVENTION

Technical Problem

The inventors of the present invention found that although epoxides have excellent curability and can be cured rapidly with less causing damage to the semiconductor chips, an epoxide having a softening point or melting point lower than 50° C. has excessively low viscosity upon heating, and, when an adhesive composition containing the epoxide is used for stacking of semiconductor chips, the semiconductor chips sink in the adhesive composition to come in contact with another member such as a support, and this may cause the semiconductor chips to be broken.

The inventors found that an epoxide having a softening point or melting point of 50° C. or higher can offer adhesiveness suitable for the bonding of semiconductor chips by heating and can bond the semiconductor chips without causing damage to the semiconductor chips.

However, the inventors also found that even an adhesive composition containing the epoxide having a softening point or melting point of 50° C. or higher, if heated after coating so as to rapidly evaporate the solvent to form an adhesive layer, may undergo curing progress during the heating and may fail to offer adhesiveness thereafter even when heated.

Accordingly, the present invention has an object to provide an adhesive composition for multilayer semiconductors as follows. Specifically, the adhesive composition, when applied and dried, can form an adhesive layer that solidifies and has approximately no adhesiveness at a temperature lower than 50° C., but softens or melts to offer appropriate adhesiveness by heating at such a temperature as to be 50° C. or higher and as to less cause damage to the semiconductor chips, and is rapidly cured thereafter to firmly bond and secure the adherends.

Solution to Problem

After intensive investigations to achieve the object, the inventors have found that an adhesive composition containing an epoxide having a softening point or melting point of 50° C. or higher, a polymerization initiator having specific curing properties, and a solvent has all the following properties.

1. The adhesive composition has excellent coatability and, when heated after coating, can be rapidly dried to form an adhesive layer while restraining curing progress.

2. The adhesive layer derived from the adhesive composition has approximately no adhesiveness at an ambient temperature lower than 50° C.

3. The adhesive layer derived from the adhesive composition offers appropriate adhesiveness when heated at such a temperature as to be 50° C. or higher and as to less cause damage to the semiconductor chips, and is rapidly cured thereafter to form a cured product having excellent heat resistance.

The present invention has been made based on these findings.

Specifically, the present invention provides, in an embodiment, an adhesive composition for multilayer semiconductors. The adhesive composition contains a polymerizable compound (A), a polymerization initiator (B), and a solvent (C). The polymerization initiator (B) contains at least one polymerization initiator selected from a cationic-polymerization initiator (B1) and an anionic-polymerization initiator (B2).

The polymerizable compound (A) contains an epoxide having a softening point or melting point (in conformity with JIS K 0064:1992) of 50° C. or higher in an amount of 80% by weight or more of the total amount of the polymerizable compound.

The cationic-polymerization initiator (B1) gives a composition having a thermal curing time (in conformity with JIS K 5909:1994) of 3.5 minutes or longer at 130° C., where the composition contains 1 part by weight of the cationic-polymerization initiator (B1) and 100 parts by weight of 3,4-epoxycyclohexylmethyl (3,4-epoxy)cyclohexanecarboxylate.

The anionic-polymerization initiator (B2) gives a composition having a thermal curing time (in conformity with JIS K 5909:1994) of 3.5 minutes or longer at 130° C., where the composition contains 1 part by weight of the anionic-polymerization initiator (B2) and 100 parts by weight of bisphenol-A diglycidyl ether.

The polymerizable compound (A) in the adhesive composition for multilayer semiconductors may contain a compound represented by Formula (1-1):

[Chem. 1]

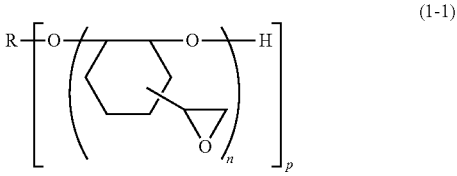

(1-1)

where R represents a straight or branched chain saturated aliphatic hydrocarbon group containing 6 or more carbon atoms; n represents, independently in each occurrence, an integer of 1 to 30; and p represents an integer of 1 to 6.

The polymerizable compound (A) in the adhesive composition for multilayer semiconductors may further contain a compound represented by Formula (7-1):

[Chem. 2]

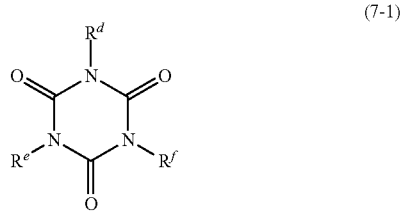

(7-1)

where $R^d$, $R^e$, and $R^f$ are each, identically or differently, selected from a hydrogen atom and an organic group optionally containing an oxirane ring structure or a hydroxy group, where at least one of $R^d$, $R^e$, and $R^f$ is an organic group containing an oxirane ring.

The organic group containing an oxirane ring structure may be a glycidyl group in the adhesive composition for multilayer semiconductors.

The compound represented by Formula (7-1) may be triglycidyl isocyanurate in the adhesive composition for multilayer semiconductors.

The adhesive composition for multilayer semiconductors may contain the cationic-polymerization initiator (B1) as the polymerization initiator (B) and may further contain a cationic-polymerization stabilizer (D) in an amount of 0.1% by weight or more relative to the cationic-polymerization initiator (B1).

The adhesive composition for multilayer semiconductors may further contain a silane coupling agent (E).

The present invention provides, in another embodiment, an adhesive sheet for multilayer semiconductors. The adhesive sheet is prepared by applying and drying the adhesive composition for multilayer semiconductors.

The present invention provides, in yet another embodiment, a semiconductor wafer with adhesive layer. This structurally includes a semiconductor wafer, and an adhesive layer disposed on or over the semiconductor wafer. The adhesive layer is derived from the adhesive composition for multilayer semiconductors.

The present invention provides, in still another embodiment, a semiconductor chip with adhesive layer. This structurally includes a semiconductor chip, and an adhesive layer disposed on or over the semiconductor chip. The adhesive layer is derived from the adhesive composition for multilayer semiconductors.

In addition and advantageously, the present invention provides a method for producing a three-dimensional multilayer semiconductor. The method includes stacking semiconductors using the adhesive composition for multilayer semiconductors.

Specifically, the present invention relates to followings.

(1) The present invention relates to an adhesive composition for multilayer semiconductors, where the adhesive composition contains a polymerizable compound (A), at least one polymerization initiator (B) selected from a cationic-polymerization initiator (B1) and an anionic-polymerization initiator (B2), and a solvent (C).

The polymerizable compound (A) contains an epoxide having a softening point or melting point (in conformity with JIS K 0064:1992) of 50° C. or higher in an amount of 80% by weight or more of the total amount of the polymerizable compound.

The cationic-polymerization initiator (B1) gives a composition having a thermal curing time (in conformity with JIS K 5909:1994) of 3.5 minutes or longer at 130° C., where the composition contains 1 part by weight of the cationic-polymerization initiator (B1) and 100 parts by weight of 3,4-epoxycyclohexylmethyl (3,4-epoxy)cyclohexanecarboxylate (e.g., trade name CELLOXIDE 2021P (supplied by Daicel Corporation)).

The anionic-polymerization initiator (B2) gives a composition having a thermal curing time (in conformity with JIS K 5909:1994) of 3.5 minutes or longer at 130° C., where the composition contains 1 part by weight of the anionic-polymerization initiator (B2) and 100 parts by weight of bisphenol-A diglycidyl ether.

(2) The adhesive composition according to (1) for multilayer semiconductors may contain an epoxide having a cycloaliphatic structure in the molecule (in particular, the compound represented by Formula (1-1)) in an amount of 80% by weight or more of the total amount (100% by weight) of the polymerizable compound (A).

(3) The adhesive composition according to one of (1) and (2) for multilayer semiconductors may contain an epoxide (A-7) having an isocyanuric skeleton (in particular, the compound represented by Formula (7-1) is preferred, of which triglycidyl isocyanurate is more preferred) in an amount of 1% to 10% by weight based on the total amount (100% by weight) of the polymerizable compound (A).

(4) The adhesive composition according to any one of (1) to (3) for multilayer semiconductors may contain at least one of a cycloaliphatic epoxide and a compound containing one or more oxetanyl groups per molecule in an amount of 1% to 20% by weight based on the total amount (100% by weight) of the polymerizable compound (A).

(5) In the adhesive composition according to any one of (1) to (4) for multilayer semiconductors, the polymerizable compound (A) may contain the compound represented by Formula (1-1), where R represents a straight or branched chain saturated aliphatic hydrocarbon group containing 6 or more carbon atoms; n represents, independently in each occurrence, an integer of 1 to 30; and p represents an integer of 1 to 6.

(6) In the adhesive composition according to any one of (1) to (5) for multilayer semiconductors, the polymerizable compound (A) may further contain the compound represented by Formula (7-1), where $R^d$, $R^e$, and $R^f$ are each, identically or differently, selected from a hydrogen atom and an organic group optionally containing an oxirane ring structure or a hydroxy group, where at least one of $R^d$, $R^e$, and $R^f$ is an organic group containing an oxirane ring structure.

(7) The organic group containing an oxirane ring structure may be a glycidyl group in the adhesive composition according to (6) for multilayer semiconductors.

(8) The compound represented by Formula (7-1) may be triglycidyl isocyanurate in the adhesive composition according to (6) for multilayer semiconductors.

(9) The adhesive composition according to any one of (1) to (8) for multilayer semiconductors may contain the polymerizable compound (A) in an amount of 30% to 80% by weight based on the total amount (100% by weight) of the adhesive composition for multilayer semiconductors.

(10) The adhesive composition according to any one of (1) to (9) for multilayer semiconductors may contain the polymerization initiator (B) in an amount of 0.01 to 10 parts by weight per 100 parts by weight of the polymerizable compound (A).

(11) The adhesive composition according to any one of (1) to (10) for multilayer semiconductors may contain the cationic-polymerization initiator (B1) as the polymerization initiator (B) and further contain a cationic-polymerization stabilizer (D) in an amount of 0.1% by weight or more relative to the cationic-polymerization initiator (B1).

(12) The cationic-polymerization stabilizer (D) may be at least one selected from the group consisting of hindered amine compounds and sulfonium sulfate compounds in the adhesive composition according to (11) for multilayer semiconductors.

(13) The adhesive composition according to any one of (1) to (12) for multilayer semiconductors may contain, as the solvent (C), a solvent having a boiling point of 170° C. or lower at 1 atmospheric pressure in an amount within such a range that the concentration of non-volatile matter in the adhesive composition for multilayer semiconductors is 30% to 80% by weight.

(14) The adhesive composition according to any one of (1) to (13) for multilayer semiconductors may further contain a silane coupling agent (E).

(15) The adhesive composition according to (14) for multilayer semiconductors may contain the silane coupling agent (E) in an amount of 0% to 10% by weight per 100 parts by weight of the polymerizable compound (A).

(16) The cationic-polymerization initiator (B1) in the adhesive composition according to any one of (1) to (15) for multilayer semiconductors may be at least one compound selected from the group consisting of aryldiazonium salts, aryliodonium salts, arylsulfonium salts, and arene-ion complexes.

(17) The anionic-polymerization initiator (B2) in the adhesive composition according to any one of (1) to (16) for multilayer semiconductors may be at least one compound selected from the group consisting of primary amines, secondary amines, tertiary amines, imidazoles, and boron trifluoride-amine complexes.

(18) The present invention also relates to an adhesive sheet for multilayer semiconductors. The adhesive sheet is derived from the adhesive composition according to any one of (1) to (17) for multilayer semiconductors via coating and drying.

(19) The present invention also relates to a semiconductor wafer with adhesive layer. This structurally includes a semiconductor wafer, and an adhesive layer disposed on or over the semiconductor wafer. The adhesive layer is derived from the adhesive composition according to any one of (1) to (17) for multilayer semiconductors.

(20) The present invention further relates to a semiconductor chip with adhesive layer. This structurally includes a semiconductor chip, and an adhesive layer disposed on or over the semiconductor chip. The adhesive layer is derived from the adhesive composition according to any one of (1) to (17) for multilayer semiconductors.

(21) The present invention also relates to a method for producing a three-dimensional multilayer semiconductor. The method includes stacking semiconductors using the adhesive composition according to any one of (1) to (17) for multilayer semiconductors.

(22) The present invention also relates to a method for producing a three-dimensional multilayer semiconductor. The method includes producing a three-dimensional multilayer semiconductor via one of a process 1 and a process 2. The process 1 includes steps 1-1, 1-2, and 1-3 as follows.

In the step 1-1, an adhesive layer is formed from the adhesive composition according to any one of (1) to (17) for multilayer semiconductors on a support to give a laminate including the support and the adhesive layer.

In the step 1-2, a semiconductor chip is placed onto the adhesive layer side of the laminate including the support and the adhesive layer to give a laminate including the support, the adhesive layer, and the semiconductor chip disposed in this order.

In the step 1-3, the adhesive layer is cured.

The process 2 includes steps 2-1, 2-2, 2-3, and 2-4 as follows.

In the step 2-1, an adhesive layer is formed from the adhesive composition according to any one of (1) to (17) for multilayer semiconductors on a semiconductor wafer to give a semiconductor wafer with adhesive layer.

In the step 2-2, the semiconductor wafer with adhesive layer is cut to give a semiconductor chip with adhesive layer.

In the step 2-3, the semiconductor chip with adhesive layer is applied to a support.

In the step 2-4, the adhesive layer is cured.

(23) In the method according to (22) for producing a three-dimensional multilayer semiconductor, the adhesive layer may be formed by a first process or a second process. In the first process, the adhesive composition according to any one of (1) to (17) for multilayer semiconductors is applied onto the support or onto the semiconductor wafer, and heated and dried at 60° C. to 120° C. In the second process, the adhesive composition according to any one of (1) to (17) for multilayer semiconductors is previously applied and dried to form an adhesive sheet for multilayer semiconductors, and the adhesive sheet is applied onto the support or onto the semiconductor wafer.

(24) In the method according to one of (22) and (23) for producing a three-dimensional multilayer semiconductor, the semiconductor chip or the support may be applied to the adhesive layer while the adhesive layer is controlled so as to have a complex viscosity of 100 Pa·s or less.

(25) In the method according to (24) for producing a three-dimensional multilayer semiconductor, the adhesive layer may be heated up to a temperature of 50° C. to 120° C. so as to have a complex viscosity of 100 Pa·s or less.

(26) In the method according to any one of (22) to (25) for producing a three-dimensional multilayer semiconductor, the adhesive layer may be cured by heating at a temperature of 140° C. to 200° C. for 0.2 to 2 hours.

(27) The present invention also relates to a three-dimensional multilayer semiconductor obtained by the method according to any one of (21) to (26) for producing a three-dimensional multilayer semiconductor.

Advantageous Effects of Invention

The adhesive composition according to the present invention for multilayer semiconductors has the configuration and, when applied to a semiconductor wafer, a support, or any other article, and dried by heating, rapidly forms an adhesive layer with less progress of curing.

The adhesive layer is solid and does not offer adhesiveness (or tackiness) at temperatures of lower than 50° C. This configuration allows easy cutting (such as dicing) of the resulting work without adhesive deposition on the cutting blade.

In addition, the adhesive layer resists progress of polymerization and has excellent storage stability.

The adhesive layer is heated at such a temperature as to be 50° C. or higher and as not to cause damage typically to the semiconductor wafer and semiconductor chip, timely when adhesiveness is desired. This allows the adhesive layer to offer appropriate adhesiveness and allows the semiconductor chip to be bonded without failure.

After the semiconductor chip bonding, the adhesive layer is heated at such a temperature as not to cause damage typically to the semiconductor wafer and the semiconductor chip. This allows the adhesive layer to be cured rapidly to form a cured product having excellent heat resistance and maintains firm bonding of the semiconductor chip typically with the support.

Accordingly, the adhesive composition according to the present invention for multilayer semiconductors is advantageously usable in the production of three-dimensional multilayer semiconductors.

DESCRIPTION OF EMBODIMENTS

Polymerizable Compound (A)

Figure 1:
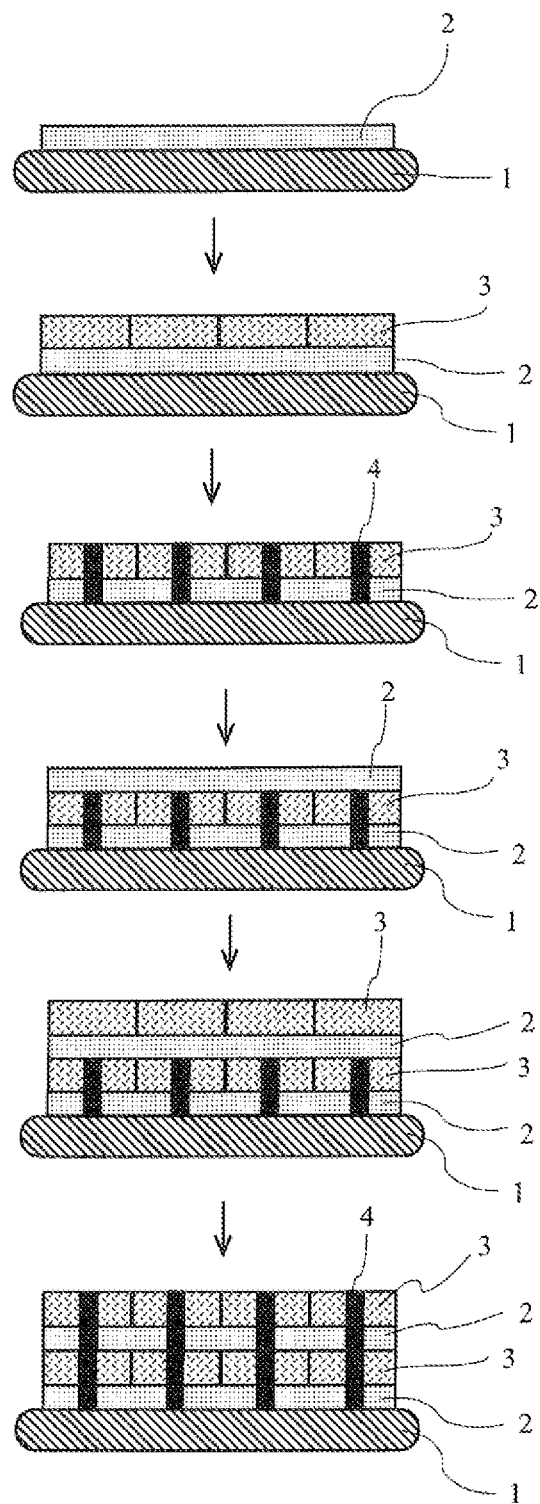
FIG. 1 schematically illustrates a method according to an embodiment of the present invention for producing a three-dimensional multilayer semiconductor, where the method uses the adhesive composition according to the present invention for multilayer semiconductors.

The polymerizable compound (A) constituting the adhesive composition according to the present invention for multilayer semiconductors includes cationically polymerizable compounds and anionically polymerizable compounds and is exemplified by, but not limited to, epoxides (epoxides). The adhesive composition may contain each of different compounds alone or in combination as the polymerizable compound (A).

Examples of the epoxides include, but are not limited to, compounds as follows:

(A-1) epoxides having a cycloaliphatic structure in the molecule;

(A-2) aromatic glycidyl ether epoxides such as bisphenol-A diglycidyl ether and bisphenol-F diglycidyl ether;

(A-3) aliphatic glycidyl ether epoxides such as mono- or poly-glycidyl ethers of aliphatic polyhydric alcohols;

(A-4) glycidyl ester epoxides;

(A-5) glycidylamine epoxides;

(A-6) compounds corresponding to compounds containing a molecular chain with a polybutadiene skeleton and/or a polyisoprene skeleton, except with part of double bonds of the molecular chain being epoxidized; and (A-7) epoxides having an isocyanuric skeleton.

The adhesive composition according to the present invention preferably contains, as the epoxide, any of the epoxides (A-1) having a cycloaliphatic structure in the molecule. This configuration offers excellent reactivity and curing in a shorter time.

When particularly excellent adhesion to a substrate is desired, the adhesive composition preferably contains any of epoxides (A-7) having an isocyanuric skeleton, in addition to any of the epoxides (A-1) having a cycloaliphatic structure in the molecule.

Non-limiting examples of the epoxides (A-1) having a cycloaliphatic structure in the molecule include compounds as follows:

(A-1-1) compounds containing an alicycle and an epoxy group directly bonded to the alicycle via a single bond;

(A-1-2) compounds containing a cycloaliphatic epoxy group (hereinafter also referred to as "cycloaliphatic epoxides"); and (A-1-3) compounds derived from aromatic glycidyl ether epoxides via hydrogenation.

Examples of the compounds (A-1-1) containing an alicycle and an epoxy group directly bonded to the alicycle via a single bond include, but are not limited to, compounds represented by Formula (1-1) below. In Formula (1-1), R represents a group corresponding to a p-hydric alcohol, except for removing OH groups in a number of p from the alcohol. R is preferably a C6 or higher straight or branched chain p-valent saturated aliphatic hydrocarbon group. Also in Formula (1-1), p represents an integer of 1 to 6, and n represents, independently in each occurrence, an integer of 1 to 30 (and is preferably an integer of 1 to 10). Non-limiting examples of the p-hydric alcohol (R—(OH)$_p$) include C6 or higher (preferably C6-C15) polyhydric alcohols such as 2,2-bis(hydroxymethyl)-1-butanol. When p is 2 or more, occurrences of n in the group in the brackets (large brackets) may be identical to or different from each other.

[Chem. 3]

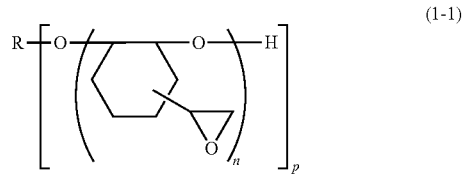

(1-1)

Of the compounds represented by Formula (1-1), preferred is a 1,2-epoxy-4-(2-oxiranyl)cyclohexane adduct of 2,2-bis(hydroxymethyl)-1-butanol with. The adduct has a softening point of 70° C. to 90° C. and is exemplified by a product under the trade name EHPE3150, supplied by Daicel Corporation.

The cycloaliphatic epoxides (A-1-2) are compounds containing a cycloaliphatic epoxy group. The cycloaliphatic epoxy group refers to an epoxy group containing an alicycle and one oxygen atom bonded in a triangular arrangement to two adjacent carbon atoms constituting the alicycle. The cycloaliphatic epoxy group is exemplified by, but not limited to, cyclohexene oxide group. Examples of the cycloaliphatic epoxides (A-1-2) include, but are not limited to, compounds represented by Formula (1-2):

[Chem. 4]

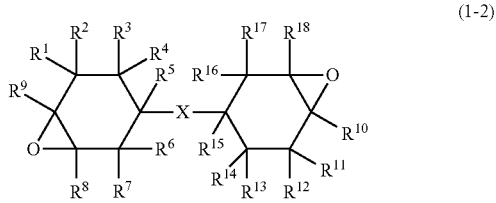

(1-2)

where $R^1$ to $R^{18}$ are each, identically or differently, selected from a hydrogen atom, a halogen atom, a hydrocarbon group optionally containing an oxygen atom or a halogen atom, and an optionally substituted alkoxy group; and X represents a single bond or a linkage group.

Examples of the halogen atom as $R^1$ to $R^{18}$ include, but are not limited to, fluorine, chlorine, bromine, and iodine atoms.

Examples of the hydrocarbon group as $R^1$ to $R^{18}$ include, but are not limited to, aliphatic hydrocarbon groups such as alkyl groups, alkenyl groups, and alkynyl groups; alicyclic hydrocarbon groups; aromatic hydrocarbon groups; and groups each containing two or more of them bonded to each other.

Non-limiting examples of the alkyl groups include $C_1$-$C_{20}$ alkyl groups such as methyl, ethyl, propyl, isopropyl, butyl, hexyl, octyl, isooctyl, decyl, and dodecyl groups, of which $C_1$-$C_{10}$ alkyl groups are preferred, and $C_1$-$C_4$ alkyl groups are particularly preferred. Examples of the alkenyl groups include, but are not limited to, $C_2$-$C_{20}$ alkenyl groups such as vinyl, allyl, methallyl, 1-propenyl, isopropenyl, 1-butenyl, 2-butenyl, 3-butenyl, 1-pentenyl, 2-pentenyl, 3-pentenyl, 4-pentenyl, and 5-hexenyl groups, of which $C_2$-$C_{10}$ alkenyl groups are preferred, and $C_2$-$C_4$ alkenyl groups are particularly preferred. Examples of the alkynyl groups include, but are not limited to, $C_2$-$C_{20}$ alkynyl groups such as ethynyl and propynyl groups, of which $C_2$-$C_{10}$ alkynyl groups are preferred, and $C_2$-$C_4$ alkynyl groups are particularly preferred.

Non-limiting examples of the alicyclic hydrocarbon groups include $C_3$-$C_{12}$ cycloalkyl groups such as cyclopropyl, cyclobutyl, cyclopentyl, cyclohexyl, and cyclododecyl groups; $C_3$-$C_{12}$ cycloalkenyl groups such as cyclohexenyl group; and $C_4$-$C_{15}$ bridged hydrocarbon groups such as bicycloheptyl and bicycloheptenyl groups.

Examples of the aromatic hydrocarbon groups include, but are not limited to, $C_6$-$C_{14}$ aryl groups such as phenyl and naphthyl groups, of which $C_6$-$C_{10}$ aryl groups are preferred.

Non-limiting examples of the groups including two or more groups selected from the group consisting of the aliphatic hydrocarbon groups, the alicyclic hydrocarbon groups, and the aromatic hydrocarbon groups include $C_3$-$C_{12}$ cycloalkyl-substituted $C_1$-$C_{20}$ alkyl groups such as cyclohexylmethyl group; $C_1$-$C_{20}$ alkyl-substituted $C_3$-$C_{12}$ cycloalkyl groups such as methylcyclohexyl group; $C_7$-$C_{18}$ aralkyl groups such as benzyl and phenethyl groups, of which $C_7$-$C_{10}$ aralkyl groups are typified; $C_6$-$C_{14}$ aryl-substituted $C_2$-$C_{20}$ alkenyl groups such as cinnamyl group; $C_1$-$C_{20}$ alkyl-substituted $C_6$-$C_{14}$ aryl groups such as tolyl group; and $C_2$-$C_{20}$ alkenyl-substituted $C_6$-$C_{14}$ aryl groups such as styryl group.

Non-limiting examples of the hydrocarbon group containing an oxygen atom or a halogen atom as $R^1$ to $R^{18}$ include groups corresponding to the hydrocarbon groups, except with at least one hydrogen atom being substituted by an oxygen-containing group or a halogen atom. Examples of the oxygen-containing group include, but are not limited to, hydroxy group; hydroperoxy group; $C_1$-$C_{10}$ alkoxy groups such as methoxy, ethoxy, propoxy, isopropyloxy, butoxy, and isobutyloxy groups; $C_2$-$C_{10}$ alkenyloxy groups such as allyloxy group; $C_6$-$C_{14}$ aryloxy groups such as tolyloxy and naphthyloxy groups, where the aryloxy groups may have one or more substituents selected from the group consisting of $C_1$-$C_{10}$ alkyl groups, $C_2$-$C_{10}$ alkenyl groups, halogen atoms, and $C_1$-$C_{10}$ alkoxy groups; $C_7$-$C_{18}$ aralkyloxy groups such as benzyloxy and phenethyloxy groups; $C_1$-$C_{10}$ acyloxy groups such as acetyloxy, propionyloxy, (meth)acryloyloxy, and benzoyloxy groups; $C_1$-$C_{10}$ alkoxycarbonyl groups such as methoxycarbonyl, ethoxycarbonyl, propoxycarbonyl, and butoxycarbonyl groups; $C_6$-$C_{14}$ aryloxycarbonyl groups such as phenoxycarbonyl, tolyloxycarbonyl, and naphthyloxycarbonyl groups, where the aryloxycarbonyl groups may have one or more substituents selected from the group consisting of $C_1$-$C_{10}$ alkyl groups, $C_2$-$C_{10}$ alkenyl groups, halogen atoms, and $C_1$-$C_{10}$ alkoxy groups; $C_7$-$C_{18}$ aralkyloxycarbonyl groups such as benzyloxycarbonyl group; epoxy-containing groups such as glycidyloxy group; oxetanyl-containing groups such as ethyloxetanyloxy group; $C_1$-$C_{10}$ acyl groups such as acetyl, propionyl, and benzoyl groups; isocyanato group; sulfo group; carbamoyl group; oxo group; and groups each containing two or more of them bonded to each other via a single bond or a group such as a $C_1$-$C_{10}$ alkylene group.

Examples of the alkoxy group as $R^1$ to $R^{18}$ include, but are not limited to, $C_1$-$C_{10}$ alkoxy groups such as methoxy, ethoxy, propoxy, isopropyloxy, butoxy, and isobutyloxy groups.

Non-limiting examples of the substituents which the alkoxy group may have include halogen atoms, hydroxy group, $C_1$-$C_{10}$ alkoxy groups, $C_2$-$C_{10}$ alkenyloxy groups, $C_6$-$C_{14}$ aryloxy groups, $C_1$-$C_{10}$ acyloxy groups, mercapto group, $C_1$-$C_{10}$ alkylthio groups, $C_2$-$C_{10}$ alkenylthio groups, $C_6$-$C_{14}$ arylthio groups, $C_7$-$C_{18}$ aralkylthio groups, carboxy group, $C_1$-$C_{10}$ alkoxycarbonyl groups, $C_6$-$C_{14}$ aryloxycarbonyl groups, $C_7$-$C_{18}$ aralkyloxycarbonyl groups, amino group, mono- or di-($C_1$-$C_{10}$ alkyl)amino groups, $C_1$-$C_{10}$ acylamino groups, epoxy-containing groups, oxetanyl-containing groups, $C_1$-$C_{10}$ acyl groups, oxo group, and groups each containing two or more of them bonded to each other via a single bond or a group such as a $C_1$-$C_{10}$ alkylene group.

Among them, $R^1$ to $R^{18}$ are preferably hydrogen atoms.

In the formula, X represents a single bond or a linkage group. Examples of the linkage group include, but are not limited to, divalent hydrocarbon groups, carbonyl group (—CO—), ether bond (—O—), ester bond (—COO—), amide bond (—CONH—), carbonate bond (—OCOO—), and groups each containing two or more of them bonded to each other. Non-limiting examples of the divalent hydrocarbon groups include straight or branched chain alkylene groups (e.g., $C_1$-$C_6$ alkylene groups) and alkylidene groups (e.g., $C_1$-$C_6$ alkylidene groups), such as methylene, ethylidene, isopropylidene, ethylene, propylene, trimethylene, and tetramethylene groups; divalent alicyclic hydrocarbon groups such as 1,2-cyclopentylene, 1,3-cyclopentylene, cyclopentylidene, 1,2-cyclohexylene, 1,3-cyclohexylene, 1,4-cyclohexylene, and cyclohexylidene groups, of which $C_3$-$C_8$ cycloalkylene groups and $C_3$-$C_8$ cycloalkylidene groups are typified; and groups each containing two or more of them bonded to each other.

Non-limiting examples of representative compounds belonging to the compounds represented by Formula (1-2) include (3,4,3',4'-diepoxy)bicyclohexyl, bis(3,4-epoxycyclohexylmethyl) ether, 1,2-epoxy-1,2-bis(3,4-epoxycyclohex-1-yl)ethane, 2,2-bis(3,4-epoxycyclohex-1-yl)propane, 1,2-bis(3,4-epoxycyclohex-1-yl)ethane, and compounds represented by Formulae (1-2-1) to (1-2-6) below. In the formula, t represents an integer of 1 to 30.

[Chem. 5]

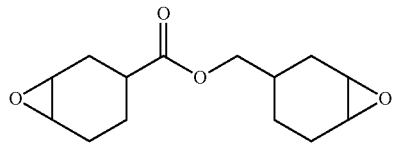
(1-2-1)

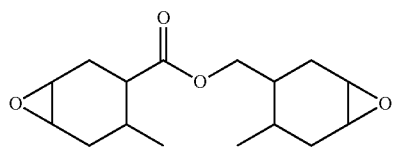
(1-2-2)

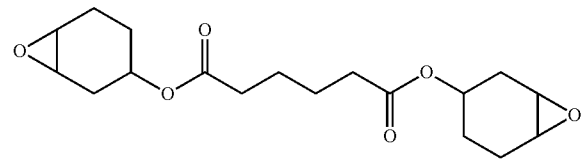
(1-2-3)

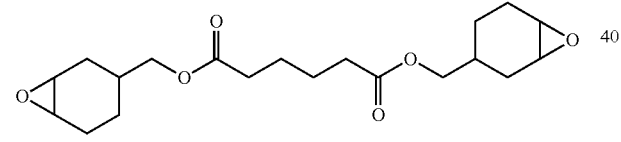
(1-2-4)

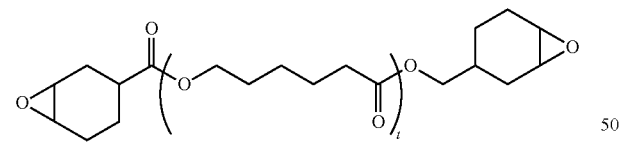
(1-2-5)

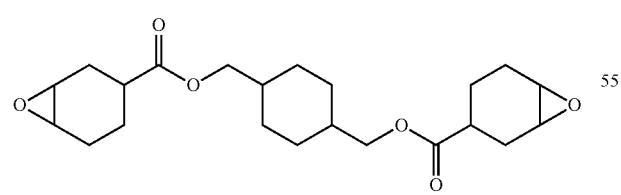
(1-2-6)

In addition to the above-mentioned compounds, example of the cycloaliphatic epoxides (A-1-2) also include a compound represented by Formula (1-2-7). This compound contains an alicycle and two or more epoxy groups per molecule, where one of the two or more epoxy groups is a cycloaliphatic epoxy group.

[Chem. 6]

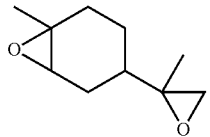
(1-2-7)

Examples of the cycloaliphatic epoxides (A-1-2) also include cycloaliphatic epoxides containing three or more cycloaliphatic epoxy groups; and cycloaliphatic epoxides containing one cycloaliphatic epoxy group, but no other epoxy group. These compounds are represented by Formulae (1-2-8) to (1-2-11) below. In the formulae, a, b, c, d, e, and f each represent, identically or differently, an integer of 0 to 30.

[Chem. 7]

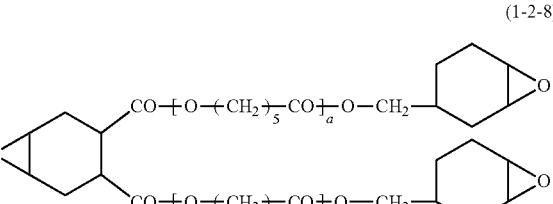
(1-2-8)

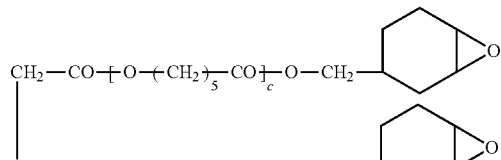
(1-2-9)

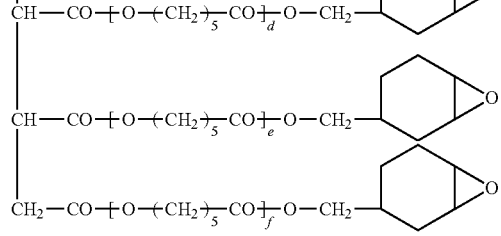

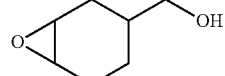
(1-2-10)

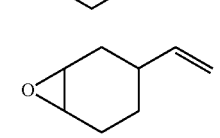
(1-2-11)

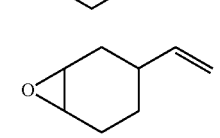

The epoxides (A-7) having an isocyanuric skeleton are isocyanuric acid derivatives and each have one or more (e.g., one to three) oxirane ring structures per molecule.

Examples of the epoxides having an isocyanuric skeleton include, but are not limited to, compounds represented by Formula (7-1):

[Chem. 8]

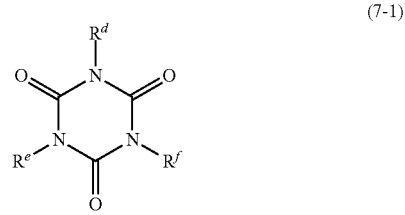

(7-1)

where $R^d$, $R^e$, and $R^f$ are each, identically or differently, selected from a hydrogen atom and an organic group optionally containing an oxirane ring structure or a hydroxy group, where at least one of $R^d$, $R^e$, and $R^f$ is an organic group containing an oxirane ring structure.

Non-limiting examples of the organic group include aliphatic hydrocarbon groups, alicyclic hydrocarbon groups, aromatic hydrocarbon groups, heterocyclic groups, and groups each containing any of these groups bonded to each other.

The aliphatic hydrocarbon groups, alicyclic hydrocarbon groups, and aromatic hydrocarbon groups are exemplified as with $R^1$ to $R^{18}$ in Formula (1-2).

Examples of heterocycles constituting the heterocyclic groups include, but are not limited to, heterocycles containing an oxygen atom as a heteroatom; heterocycles containing a sulfur atom as a heteroatom; and heterocycles containing a nitrogen atom as a heteroatom. Non-limiting examples of the oxygen-containing heterocycles include four-membered rings such as oxetane ring; five-membered rings such as furan, tetrahydrofuran, and oxazole rings; six-membered rings such as 4-oxo-4H-pyran, tetrahydropyran, and morpholine rings; fused rings such as benzofuran and isobenzofuran rings; bridged rings such as 3-oxatricyclo[4.3.1.1$^{4,8}$]undecan-2-one ring. Non-limiting examples of the sulfur-containing heterocycles include five-membered rings such as thiophene and triazole rings; six-membered rings such as 4-oxo-4H-thiopyran ring; and fused rings such as benzothiophene ring. Non-limiting examples of the nitrogen-containing heterocycles include five-membered rings such as pyrrole, pyrrolidine, pyrazole, imidazole, and triazole rings; six-membered rings such as pyridine, pyridazine, and pyrimidine rings; and fused rings such as indole and quinoline rings.

Examples of the groups including two or more of the above groups bonded to each other include, but are not limited to, groups each containing one or more of the above-mentioned groups bonded to each other via a single bond or a linkage group. The linkage group is exemplified as with X in Formula (1-2).

The organic group may have one or more substituents such as hydroxy group, carboxy group, and halogen atoms.

Of such organic groups containing an oxirane ring structure, preferred examples include epoxy, glycidyl (i.e., 2,3-epoxypropyl), 2-methylepoxypropyl, (3,4-epoxycyclohexyl)methyl, and (3,4-epoxycyclohexyl)ethyl groups, of which glycidyl group is particularly preferred for its easy availability.

Of the hydroxy-containing organic groups, preferred examples include 2-hydroxyethyl and 3-hydroxypropyl groups.

Of the organic groups, preferred examples include benzyl, allyl, 2-methylpropenyl, and methyl groups.

Representative, but non-limiting examples of the compounds represented by Formula (7-1) include 1,3-dibenzyl-5-glycidyl isocyanurate, 1-glycidyl-3,5-diphenyl isocyanurate, 1-allyl-3,5-diglycidyl isocyanurate, 1-glycidyl-3,5-di (2-hydroxyethyl) isocyanurate, 1-(2-hydroxyethyl)-3,5-diglycidyl isocyanurate, 1-allyl-3,5-bis(2-methylepoxypropyl) isocyanurate, 1-(2-methylpropenyl)-3,5-diglycidyl isocyanurate, 1-(2-methylpropenyl)-3,5-bis(2-methylepoxypropyl) isocyanurate, 1-glycidyl-3,5-diallyl isocyanurate, 1,3-diallyl-5-(2-methylepoxypropyl) isocyanurate, 1,3-bis(2-methylpropenyl)-5-glycidyl isocyanurate, 1,3-bis(2-methylpropenyl)-5-(2-methylepoxypropyl) isocyanurate, triglycidyl isocyanurate, and tris(2-methylepoxypropyl) isocyanurate. The polymerizable compound (A) may contain each of them alone or in combination.

Among them, the polymerizable compound (A) for use in the present invention preferably contains triglycidyl isocyanurate (melting point: 108° C.), because this configuration imparts excellent substrate adhesion to the adhesive composition for multilayer semiconductors.

The polymerizable compound (A) may contain one or more of other polymerizable compounds in addition to the epoxide(s). Non-limiting examples of the other polymerizable compounds include compounds containing, as a polymerizable group, at least one of oxetanyl group and vinyl ether group, which are typified by compounds containing one or more oxetanyl groups per molecule and compounds containing one or more vinyl ether groups per molecule. The polymerizable compounds may each contain one or more other groups in addition to the polymerizable functional group(s), such as hydroxy group, carboxy group, ether bond, and ester bond. The other polymerizable compounds have a softening point or a melting point of typically about 50° C. or higher, preferably 50° C. to 130° C., and particularly preferably 60° C. to 100° C., where the softening point is determined in conformity with JIS K 7234:1986, and the melting point is determined in conformity with JIS K 0064:1992.

Examples of the compounds containing one or more oxetanyl groups per molecule include, but are not limited to, 3,3-bis(vinyloxymethyl)oxetane, 3-ethyl-3-hydroxymethyloxetane, 3-ethyl-3-(2-ethylhexyloxymethyl)oxetane, 3-ethyl-3-(hydroxymethyl)oxetane, 3-ethyl-3-[(phenoxy)methyl]oxetane, 3-ethyl-3-(hexyloxymethyl)oxetane, 3-ethyl-3-(chloromethyl)oxetane, 3,3-bis(chloromethyl)oxetane, 1,4-bis[(3-ethyl-3-oxetanylmethoxy)methyl]benzene, bis([1-ethyl(3-oxetanyl)]methyl) ether, 4,4'-bis[(3-ethyl-3-oxetanyl)methoxymethyl]bicyclohexyl, 1,4-bis[(3-ethyl-3-oxetanyl)methoxymethyl]cyclohexane, 1,4-bis([(3-ethyl-3-oxetanyl)methoxy]methyl)benzene, 3-ethyl-3 ([(3-ethyloxetan-3-yl)methoxy]methyl)oxetane, and xylylene bisoxetane. Commercial products available typically under the trade names OXT221 and OXT121 (each from Toagosei Co., Ltd.) may also be used in the present invention.

Examples of the compounds containing one or more vinyl ether groups per molecule include, but are not limited to, 2-hydroxyethyl vinyl ether, 3-hydroxypropyl vinyl ether, 2-hydroxypropyl vinyl ether, 2-hydroxyisopropyl vinyl ether, 4-hydroxybutyl vinyl ether, 3-hydroxybutyl vinyl ether, 2-hydroxybutyl vinyl ether, 3-hydroxyisobutyl vinyl ether, 2-hydroxyisobutyl vinyl ether, 1-methyl-3-hydroxypropyl vinyl ether, 1-methyl-2-hydroxypropyl vinyl ether, 1-hydroxymethylpropyl vinyl ether, 4-hydroxycyclohexyl vinyl ether, 1,6-hexanediol monovinyl ether, 1,4-cyclohexanedimethanol monovinyl ether, 1,3-cyclohexanedimethanol monovinyl ether, 1,2-cyclohexanedimethanol monovinyl ether, p-xylene glycol monovinyl ether, m-xylene glycol monovinyl ether, o-xylene glycol monovinyl ether, diethylene glycol monovinyl ether, triethylene glycol monovinyl ether, tetraethylene glycol monovinyl ether, pentaethylene glycol monovinyl ether, oligoethylene glycol monovinyl ethers, poly(ethylene glycol) monovinyl ethers, dipropylene glycol monovinyl ether, tripropylene glycol monovinyl ether, tetrapropylene glycol monovinyl ether, pentapropylene glycol monovinyl ether, oligopropylene glycol monovinyl ethers, poly(propylene glycol) monovinyl ethers, and derivatives of them.

The adhesive composition according to the present invention for multilayer semiconductors contains, of the epoxides, an epoxide having a softening point or melting point of 50° C. or higher in an amount of 80% by weight or more (preferably 85% by weight or more, and particularly preferably 90% by weight or more, based on the total amount of the polymerizable compound (A), where the softening point is determined in conformity with JIS K 7234:1986, and the melting point is determined in conformity with JIS K 0064:1992. When the adhesive composition contains two or more epoxides of this type, the "amount" refers to the total amount of them. The upper limit of the amount is typically 100% by weight, and preferably 95% by weight. The softening point or melting point is preferably 50° C. to 120° C., particularly preferably 60° C. to 110° C., and most preferably 60° C. to 100° C. The adhesive composition, if containing the epoxide(s) having a softening point or melting point of 50° C. or higher in an amount lower than the range (namely, if containing a polymerizable compound having a softening point or melting point lower than 50° C. in an excessively large amount), gives an adhesive layer that offers an excessively low viscosity upon heating. This may cause the semiconductor chip to sink in the adhesive layer and to be broken due typically to contact with a support.

Non-limiting examples of the epoxides having a softening point or melting point of 50° C. or higher include the compounds (A-1-1) containing an alicycle and an epoxy group directly bonded to the alicycle via a single bond, including the compounds represented by Formula (1-1) such as 1,2-epoxy-4-(2-oxiranyl)cyclohexane adduct of 2,2-bis(hydroxymethyl)-1-butanol (e.g., trade name EHPE3150, supplied by Daicel Corporation) (softening point: 70° C. to 90° C.); and the epoxides (A-7) having an isocyanuric skeleton, including the compounds represented by Formula (7-1) such as triglycidyl isocyanurate (melting point: 108° C.)

In particular, the amount of the compound(s) (A-1-1) containing an alicycle and an epoxy group directly bonded to the alicycle via a single bond is preferably 80% by weight or more, and particularly preferably 85% by weight or more based on the total amount (100% by weight) of the polymerizable compound (A), where the compound(s) (A-1-1) serves as the epoxide having a softening point or melting point of 50° C. or higher. The upper limit of the amount is 100% by weight, preferably 95% by weight, and particularly preferably 90% by weight.

The amount of the epoxide(s) (A-7) having an isocyanuric skeleton is preferably about 1% to about 10% by weight, and particularly preferably 2% to 5% by weight based on the total amount (100% by weight) of the polymerizable compound (A), where the epoxide(s) (A-7) serves as the epoxide having a softening point or melting point of 50° C. or higher.

The polymerizable compound (A) for use in the present invention preferably further contains at least one selected from the group consisting of the cycloaliphatic epoxides (A-1-2) and the compounds containing one or more oxetanyl groups per molecule. This is preferred for higher curing rate and better workability.

The amount of the at least one selected from the group consisting of the cycloaliphatic epoxides (A-1-2) and the compounds containing one or more oxetanyl groups per molecule is typically 1% by weight or more (e.g., 1% to 20% by weight), and preferably 5% by weight or more (e.g., 5% to 15% by weight), based on the total amount (100% by weight) of the polymerizable compound (A). When the adhesive composition contains two or more of these components, the "amount" refers to the total amount of them.

The content of the polymerizable compound (A) based on the total amount (100% by weight) of the adhesive composition according to the present invention for multilayer semiconductors is not limited, as long as being approximately such a content as to form an adhesive layer having a uniform thickness typically by spin coating. The content is typically about 30% to about 80% by weight, preferably 40% to 70% by weight, and particularly preferably 50% to 60% by weight. The adhesive composition according to the present invention for multilayer semiconductors may further contain one or more polymerizable compounds (e.g., radically polymerizable compounds) other than the polymerizable compounds (A) (e.g., cationically polymerizable compounds and/or anionically polymerizable compounds). However, the proportion of the polymerizable compounds (A) is typically 70% by weight or more, preferably 80% by weight or more, particularly preferably 90% by weight or more, and most preferably 95% by weight or more, of all polymerizable compounds contained in the adhesive composition according to the present invention for multilayer semiconductors.

Polymerization Initiator (B)

The polymerization initiator (B) for use in the present invention includes a cationic-polymerization initiator (B1) and an anionic-polymerization initiator (B2). The cationic-polymerization initiator (B1) is a compound that generates, upon heating, a cationic species to initiate a curing reaction of a polymerizable compound. The anionic-polymerization initiator (B2) is a compound that generates, upon heating, an anionic species to initiate a curing reaction of a polymerizable compound. The polymerization initiator (B) may contain each of them alone or in combination.

The cationic-polymerization initiator (B1) for use in the present invention is a polymerization initiator that gives a composition having a thermal curing time of 3.5 minutes or longer (e.g., 3.5 to 7.0 minutes, and preferably 4.5 to 6.0 minutes) at 130° C., where the composition contains 1 part by weight of the cationic-polymerization initiator (B1) and 100 parts by weight of 3,4-epoxycyclohexylmethyl (3,4-epoxy)cyclohexanecarboxylate (e.g., trade name CELLOXIDE 2021P (supplied by Daicel Corporation)).

The anionic-polymerization initiator (B2) for use in the present invention is a polymerization initiator that gives a composition having a thermal curing time of 3.5 minutes or longer at 130° C., where the composition contains 1 part by weight of the anionic-polymerization initiator (B2) and 100 parts by weight of bisphenol-A diglycidyl ether, where the thermal curing time is determined in conformity with JIS K 5909:1994.

As used herein the term "thermal curing time" refers to the time (duration) until the composition becomes rubbery upon heating of the composition on a hot plate (more specifically, until the composition undergoes curing progress and becomes unliftable as a thread from the needlepoint of the measuring needle), where the time is determined by a method in conformity with JIS K 5909:1994. A polymerization initiator giving a composition having a thermal curing time shorter than the range, if used and subjected to heating and drying, generates a cationic species upon use of a cationic-polymerization initiator (B1) and generates an anionic species upon use of an anionic-polymerization initiator (B2), and causes the polymerization to gradually proceed thereafter even at room temperature. This impedes the formation of an adhesive layer having storage stability.

Examples of the cationic-polymerization initiator (B1) include, but are not limited to, aryldiazonium salts, aryliodonium salts, arylsulfonium salts, and allene-ion complexes. In particular, arylsulfonium salts are preferred in the present invention, of which compounds containing $PF_6^-$ as an anionic species are particularly preferred. The compounds are exemplified by, but not limited to, $PF_6^-$ arylsulfonium salts represented by Formula (2) below. Non-limiting examples of the arylsulfonium salts include 4-hydroxyphenyldimethylsulfonium hexafluorophosphate, 4-acetoxyphenyldimethylsulfonium hexafluorophosphate, 4-acetoxyphenylbenzylmethylsulfonium hexafluorophosphate, 4-acetoxyphenyldimethylsulfonium hexafluorophosphate, 4-acetoxyphenylmethyl-2-naphthylmethylsulfonium hexafluorophosphate, 4-methoxycarbonyloxyphenyldimethylsulfonium hexafluorophosphate, 4-(methanesulfonyloxy)phenyldimethylsulfonium hexafluorophosphate, 4-(methanesulfonyloxy)phenylbenzylmethylsulfonium hexafluorophosphate, and 4-(methanesulfonyloxy)phenyldimethylsulfonium hexafluorophosphate. The polymerization initiator (B) may contain each of them alone or in combination. The present invention may advantageously employ any of commercial products available typically under the trade names San-Aid SI-110L, San-Aid SI-145L, San-Aid SI-150L, San-Aid SI-160L, and San-Aid SI-180L (each from SANSHIN CHEMICAL INDUSTRY CO., LTD.).

[Chem. 9]

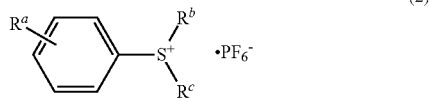

(2)

where $R^a$ represents a group selected from a hydroxy group, a $C_1$-$C_4$ alkyl group, a methoxycarbonyl group, an acetyl group, and a benzyloxycarbonyl group; $R^b$ represents a group selected from a $C_1$-$C_4$ alkyl group, a benzyl group optionally substituted with a $C_1$-$C_4$ alkyl group, and an α-naphthylmethyl group; and $R^c$ represents a $C_1$-$C_4$ alkyl group.

Examples of the anionic-polymerization initiator (B2) include, but are not limited to, primary amines, secondary amines, tertiary amines, imidazoles, and boron trifluoride-amine complexes. Non-limiting examples of the imidazoles include 2-ethyl-4-methylimidazole, 2-phenylimidazole, 1-(2-cyanoethyl)-2-ethyl-4-methylimidazole, 2,4-diamino-6-[2-methylimidazolyl-(1)]ethyl-s-triazine, 2-phenylimidazoline, 2,3-dihydro-1H-pyrrolo[1,2-a]benzimidazole, 1-cyanoethyl-2-methylimidazole, and 1-cyanoethyl-2-undecylimidazole. Non-limiting examples of the tertiary amines include tris(dimethylaminomethyl)phenol, benzyldimethylamine, and 1,8-diazabicyclo(5,4,0)undecene-7 (DBU).

The amount of the polymerization initiator (B) is typically about 0.01 to about 10 parts by weight, preferably 0.1 to 5 parts by weight, and particularly preferably 0.3 to 3 parts by weight, per 100 parts by weight of the polymerizable compound (A) (when the polymerizable compound (A) contains two or more different polymerizable compounds, the total amount of them) contained in the adhesive composition according to the present invention for multilayer semiconductors. When the polymerization initiator (B) contains two or more different polymerization initiators, the "amount" refers to the total amount of them. The polymerization initiator (B), if used in an amount less than the range, may tend to cause the cured product to have lower heat resistance because of curing rate reduction and/or uncured components increase. In contrast, the polymerization initiator (B), if used in an amount greater than the range, does not effectively offer a higher curing rate, but contrarily tends to lead to lower storage stability and to lower economic efficiency due to the increased amount of the expensive polymerization initiator.

The amount (when containing two or more different ones, the total amount of them) of the cationic-polymerization initiator (B1) is typically about 0.01 to about 10 parts by weight, preferably 0.1 to 5 parts by weight, and particularly preferably 0.3 to 3 parts by weight, per 100 parts by weight of the polymerizable compound (A) (when containing two or more different ones, the total amount of them) contained in the adhesive composition according to the present invention for multilayer semiconductors.

The amount (when containing two or more different ones, the total amount of them) of the anionic-polymerization initiator (B2) is typically about 0.01 to about 10 parts by weight, preferably 0.1 to 5 parts by weight, and particularly preferably 0.3 to 3 parts by weight, per 100 parts by weight of the polymerizable compound (A) (when containing two or more different ones, the total amount of them) contained in the adhesive composition according to the present invention for multilayer semiconductors.

The adhesive composition according to the present invention may further contain any of polymerization initiators (including cationic-polymerization initiators and anionic-polymerization initiators) that have a thermal curing time of shorter than 3.5 minutes at 130° C. However, the polymerization initiator (B) preferably contains at least one of the cationic-polymerization initiator (B1) and the anionic-polymerization initiator (B2), each having a thermal curing time of 3.5 minutes or longer at 130° C., in an amount of 85% by weight or more, more preferably 90% by weight or more, and particularly preferably 95% by weight or more, based on the total amount of the polymerization initiator (B). The adhesive composition, if containing a polymerization initiator having a thermal curing time of shorter than 3.5 minutes at 130° C. in an excessively large amount and subjected to heating and drying, undergoes generation of a cationic species upon combination use with the cationic-polymerization initiator (B1), or undergoes generation of an anionic species upon combination use with the anionic-polymerization initiator (B2), and undergoes gradually proceeding polymerization thereafter even at room temperature. This tends to cause the adhesive composition to hardly offer adhesiveness upon bonding. Namely, the adhesive composition tends to offer lower storage stability.

Solvent (C)

The solvent (C) is not limited, as long as the solvent is capable of dissolving the polymerizable compound (A), the polymerization initiator (B), and additives to be used as needed, and not adversely affects the polymerization.

The solvent (C) is preferably selected from solvents that can impart suitable fluidity for spin coating and are easily removable by heating at such a temperature as to eliminate or minimize polymerization progress. The solvent (C) is preferably one or more solvents selected from solvents having a boiling point of 170° C. or lower at 1 atmospheric pressure. Non-limiting examples of the solvents of this type include toluene, butyl acetate, methyl isobutyl ketone, xylenes, mesitylene, propylene glycol monomethyl ether, propylene glycol monomethyl ether acetate, and cyclohexanone.

The adhesive composition for multilayer semiconductors preferably contains the solvent (C) in an amount within such a range as to have a concentration of non-volatile matter of typically about 30% to about 80% by weight, preferably 40% to 70% by weight, and particularly preferably 50% to 60% by weight. This allows the adhesive composition to offer excellent coatability upon application by spin coating. The adhesive composition for semiconductors, if containing the solvent in an excessively large amount, has an excessively low viscosity and tends to hardly form an adhesive layer having an appropriate thickness (typically about 0.5 to about 30 µm). In contrast, the adhesive composition for multilayer semiconductors, if containing the solvent in an excessively small amount, has an excessively high viscosity and tends to be hardly applied to a support or a semiconductor wafer uniformly.

Other Components

The adhesive composition according to the present invention for multilayer semiconductors may further contain one or more other components as needed, in addition to the polymerizable compound (A), the polymerization initiator (B), and the solvent (C). Examples of the other components include, but are not limited to, cationic-polymerization stabilizers, silane coupling agents, adhesion imparting agents, fillers, antifoaming agents, leveling agents, surfactants, flame retardants, ultraviolet absorbers, ion adsorbents, phosphors, release agents, pigment dispersants, and dispersing aids.

Cationic-Polymerization Stabilizer (D)

The cationic-polymerization stabilizer (D) is a compound that traps cations to restrain cationic polymerization progress and, at a stage when the cationic-polymerization stabilizer has saturated cation-trapping ability and loses its activity, functions to cause the polymerization to proceed. The adhesive composition for multilayer semiconductors, when further containing the cationic-polymerization stabilizer (D) and when being applied and dried, gives an adhesive layer that is restrained from polymerization progress over a long time after the formation. The adhesive layer offers excellent adhesiveness by heating at a timing when adhesiveness is required and has excellent storage stability.

Non-limiting examples of the cationic-polymerization stabilizer (D) include hindered amine compounds such as bis(2,2,6,6-tetramethyl-4-piperidyl) sebacate, poly([6-(1,1,3,3-tetramethylbutyl)imino-1,3,5-triazine-2,4-diyl][(2,2,6,6-tetramethyl-4-piperidyl)imino]hexamethylene[(2,2,6,6-tetramethyl-4-piperidyl)imino]), tetrakis(2,2,6,6-tetramethyl-4-piperidyl)butane-1,2,3,4-tetracarboxylate, 2,2,6,6-tetramethyl-4-piperidinylbenzoate, (mixed 2,2,6,6-tetramethyl-4-piperidyl/tridecyl)-1,2,3,4-butanetetracarboxylate, mixed (2,2,6,6-tetramethyl-4-piperidyl,β,β,β',β'V-tetramethyl-3-9-[2,4,8,10-tetraoxaspiro(5.5)undecane]diethyl)-1,2,3,4-butanetetracarboxylate, poly([6-N-morpholyl-1,3,5-triazine-2,4-diyl][(2,2,6,6-tetramethyl-4-piperidyl)imino]hexamethylene[(2,2,6,6-tetramethyl-4-piperidyl)imino]), [N-(2,2,6,6-tetramethyl-4-piperidyl)-2-methyl-2-(2,2,6,6-tetramethyl-4-piperidyl)imino]propionamide, products available under the trade names LA-77, LA-67, and LA-57 (each from ADEKA Corporation), and the trade names TINUVIN 123 and TINUVIN 152 (each from Ciba Japan K.K.); and sulfonium sulfate compounds such as (4-hydroxyphenyl)dimethylsulfonium methylsulfate (Auxiliary for San-Aid SI Series, supplied by SANSHIN CHEMICAL INDUSTRY CO., LTD.). The adhesive composition may contain each of different cationic-polymerization stabilizers alone or in combination as the cationic-polymerization stabilizer (D).

Assume that the adhesive composition according to the present invention for multilayer semiconductors contains the cationic-polymerization initiator (B1) as the polymerization initiator (B). In this case, the amount of the cationic-polymerization stabilizer (D) is typically about 0.1% by weight or more, preferably 0.3% to 5% by weight, and particularly preferably 0.5% to 2% by weight, relative to the cationic-polymerization initiator (B1).

Silane Coupling Agent (E)

The adhesive composition according to the present invention for multilayer semiconductors, when further containing a silane coupling agent, imparts still excellent properties such as adhesion, weatherability, and heat resistance to the resulting cured product.

Non-limiting examples of the silane coupling agent (E) include 3-trimethoxysilylpropyl (meth)acrylate, 3-triethoxysilylpropyl (meth)acrylate, 3-dimethoxymethylsilylpropyl (meth)acrylate, 3-diethoxymethylsilylpropyl (meth)acrylate, 2-(3,4-epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, and 3-glycidoxypropyltriethoxysilane. The adhesive composition may contain each of different silane coupling agents alone or in combination as the silane coupling agent (E). The adhesive composition, when containing a silane coupling agent containing a (meth)acryloyloxy functional group, may further contain a small amount of a radical polymerization initiator.

The present invention may employ any of commercial products available typically under the trade name KBE-403 (3-glycidoxypropyltriethoxysilane, from Shin-Etsu Chemical Co., Ltd.), and the trade name Z-6040 (3-glycidoxypropyltrimethoxysilane, from Dow Corning Toray Co., Ltd.).

The amount of the silane coupling agent (E) is typically about 0 to about 10 parts by weight per 100 parts by weight of the polymerizable compound (when containing two or more different ones, the total amount of them) contained in the adhesive composition according to the present invention for multilayer semiconductors. The upper limit of the amount is preferably 5 parts by weight, particularly preferably 3 parts by weight, and most preferably 1 part by weight. The lower limit of the amount is preferably 0.005 part by weight, and particularly preferably 0.01 part by weight.

Adhesion Imparting Agent (F)

The adhesion imparting agent (F) is a hydroxy-containing compound, is incorporated as a terminal end into the cured product upon polymerization, and offers adhesion. The adhesive composition according to the present invention for multilayer semiconductors, when further containing the adhesion imparting agent (F), imparts still excellent substrate adhesion to the resulting cured product.

Examples of the adhesion imparting agent (F) include, but are not limited to, ethylene glycol, diethylene glycol, propylene glycol, and tri(2-hydroxyethyl)isocyanurate. The adhesive composition may contain each of different adhesion imparting agents alone or in combination as the adhesion imparting agent (F).

The amount of the adhesion imparting agent (F) is typically about 0.001 to about 10 parts by weight per 100 parts by weight of the polymerizable compound (when containing two or more different ones, the total amount of them) contained in the adhesive composition according to the present invention for multilayer semiconductors. The upper limit of the amount is preferably 5 parts by weight, particularly preferably 3 parts by weight, and most preferably 1 part by weight. The lower limit of the amount is preferably 0.005 part by weight, and particularly preferably 0.01 part by weight.

Filler

The adhesive composition according to the present invention for multilayer semiconductors, when further containing a filler, imparts still excellent properties such as heat resistance and low linear expansibility to the resulting cured product. The filler is exemplified by inorganic fillers and organic fillers.

Examples of the inorganic fillers include, but are not limited to, silica, alumina, magnesia, titania, antimony oxide, talc, clay, montmorillonite, hydrotalcite, synthetic mica, calcium carbonate, aluminum hydroxide, and magnesium hydroxide. Among them, silica (in particular, spheroidal silica) and alumina are preferred.

The inorganic fillers each have an average particle diameter of typically 0.05 to 1 µm, and preferably 0.1 to 0.8 µm.

Examples of the organic fillers include, but are not limited to, polyimides, poly(ether ether ketone)s, aramids, and cellulose. Among them, polyimides (in particular, spheroidal polyimides) and poly(ether ether ketone)s (in particular, spheroidal poly(ether ether ketone)s) are preferred.

The blending amount of the filer is typically 0% to 70% by weight (e.g., 0.1% to 70% by weight), preferably 0% to 50% by weight (e.g., 1% to 50% by weight), and particularly preferably 0% to 40% by weight (e.g., 5% to 40% by weight) per 100 parts by weight of the polymerizable compound (when containing two or more different ones, the total amount of them) contained in the adhesive composition according to the present invention for multilayer semiconductors.

The adhesive composition according to the present invention for multilayer semiconductors may be prepared by stirring and mixing the components with debubbling in a vacuum as needed. The stirring and mixing may be performed at a temperature of typically about 20° C. to about 50° C. The stirring and mixing may be performed using any of known apparatuses such as planetary centrifugal mixers, single- or multi-screw extruders, planetary mixers, kneaders, and dissolvers.

With the adhesive composition according to the present invention for multilayer semiconductors, a semiconductor chip may be stacked over a support typically via Process 1 or Process 2 below, and this is repeated multiple times to give a three-dimensional multilayer semiconductor. Formation of one or more through-silicon vias through the semiconductor chip(s) after one-layer stacking or multilayer stacking gives a three-dimensional multilayer semiconductor device. The curing of the adhesive layer may be performed on single layer stacking basis or at once after multiple layer-stacking operations.

Process 1

Process 1 includes the steps 1-1, 1-2, and 1-3 below.

In the step 1-1, an adhesive layer is formed from the adhesive composition for multilayer semiconductors on a support to give a laminate including the support and the adhesive layer.

In the step 1-2, a semiconductor chip is placed (affixed) onto the adhesive layer side of the laminate including the support and the adhesive layer to give a laminate including the support, the adhesive layer, and the semiconductor chip disposed in this order.

In the step 1-3, the adhesive layer is cured.

Process 2

Process 2 includes steps 2-1, 2-2, 2-3, and 2-4 as follows.

In the step 2-1, an adhesive layer is formed from the adhesive composition for multilayer semiconductors on a semiconductor wafer to give a semiconductor wafer with adhesive layer.

In the step 2-2, the semiconductor wafer with adhesive layer is cut to give a semiconductor chip with adhesive layer.

In the step 2-3, the semiconductor chip with adhesive layer is applied onto a support.

In the step 2-4, the adhesive layer is cured.

The formation of the adhesive layer from the adhesive composition for multilayer semiconductors on the support or on the semiconductor wafer may be performed typically by a process of applying the adhesive composition for multilayer semiconductors onto the support or semiconductor wafer surface and drying the applied composition; or by a process of previously preparing an adhesive sheet for multilayer semiconductors via coating and drying of the adhesive composition for multilayer semiconductors, and applying the adhesive sheet to the support or semiconductor wafer surface.

The application (coating) of the adhesive composition for multilayer semiconductors may be performed typically by spin coating, squeegee coating, screen coating, or ink-jet coating.

The drying may be performed by air drying, but is preferably performed by heating at such a temperature as to less cause polymerization progress (typically about 60° C. to about 120° C., and preferably 80° C. to 100° C.). This is preferred for rapid drying. The heating may be performed at a constant temperature or stepwise varying temperatures. According to the present invention, the adhesive composition for multilayer semiconductors is used. This restrains curing progress and maintains adhesiveness even when the adhesive composition is dried by heating.

The adhesive layer and the adhesive sheet for multilayer semiconductors each have a thickness of typically about 0.5 to about 30 µm, and preferably 1 to 10 µm.

The adhesive layer and the adhesive sheet for multilayer semiconductors are in a solid state and do not have adhesiveness at temperatures of lower than 50° C. Thus, the adhesive layer and the adhesive sheet can be cut without adhesive deposition on the cutting blade at an ambient temperature of lower than 50° C. The adhesive layer and the adhesive sheet for multilayer semiconductors soften or melt to offer adhesiveness by heating at a temperature equal to or higher than the softening point or melting point of the contained polymerizable compound(s). In particular, the adhesive layer or the adhesive sheet for multilayer semiconductors, when containing the cationic-polymerization stabilizer (D), have excellent storage stability and less suffer from polymerization progress even when the adhesive layer and the adhesive sheet are left stand typically at a temperature of 25° C. and relative humidity of 60% for about 30 days. The adhesive layer and the adhesive sheet soften or melt to offer adhesiveness by heating at a timing when adhesiveness is required. This allows the adhesive layer and the adhesive sheet to be distributed in the form of an adhesive sheet for multilayer semiconductors, a semiconductor wafer with adhesive layer, and a semiconductor chip with adhesive layer. The adhesive layer, when distributed in the form of the semiconductor wafer with adhesive layer or the semiconductor chip with adhesive layer, also functions as a protector that protects the semiconductor wafer and semiconductor chip, which are thinned and becomes susceptible to failure.

The adhesive layer and the adhesive sheet for multilayer semiconductors offers adhesiveness by heating at a temperature equal to or higher than the softening point or melting point of the contained polymerizable compound(s) (namely, at a temperature of 50° C. or higher, preferably 50° C. to 120° C., and particularly preferably 60° C. to 100° C.) for about 1 to about 20 minutes (preferably 5 to 10 minutes). The heating causes the adhesive layer and the adhesive sheet for multilayer semiconductors to have a lowered complex viscosity of typically 100 Pa·s or less, preferably 10 Pa·s or less, and particularly preferably 0.1 to 10 Pa·s. Control of the heating temperature within the range allows the adhesive layer and the adhesive sheet to offer a desired viscosity.

The application (affixation) of the semiconductor chip may be performed by compression bonding typically at a load of about 200 to about 1000 kgf/m$^2$ and preferably 400 to 800 kgf/m$^2$ for a duration of about 1 to about 15 minutes and preferably 5 to 10 minutes. The application is preferably performed under reduced pressure so as to eliminate or minimize air remaining in the adhesive face.

The adhesive layer may be cured by heating the adhesive layer at a temperature (typically about 140° C. to about 200° C., and preferably 150° C. to 180° C.) equal to or higher than a temperature at which polymerization is immediately initiated, for about 0.2 hour to about 2 hours (preferably 0.5 to 1 hour). The heating may be performed at a constant temperature or at stepwise varying temperatures. The adhesive composition according to the present invention for multilayer semiconductors, as using the epoxide as the polymerizable compound, can be cured in a short time even at a relatively low temperature as mentioned above, where the cured product has a degree of cure of typically 80% or more, preferably 90% or more, and particularly preferably 95% or more, as determined by DSC. This allows efficient production of a laminate (multilayer semiconductor) while protecting the semiconductor chip from damage due to heat. The heating, if performed at a temperature higher than the range, tends to cause the semiconductor chip to be susceptible to damage due to heat. In contrast, the heating, if performed at an excessively low temperature, tends to cause lowered workability due to a long curing time.

Figure 2:
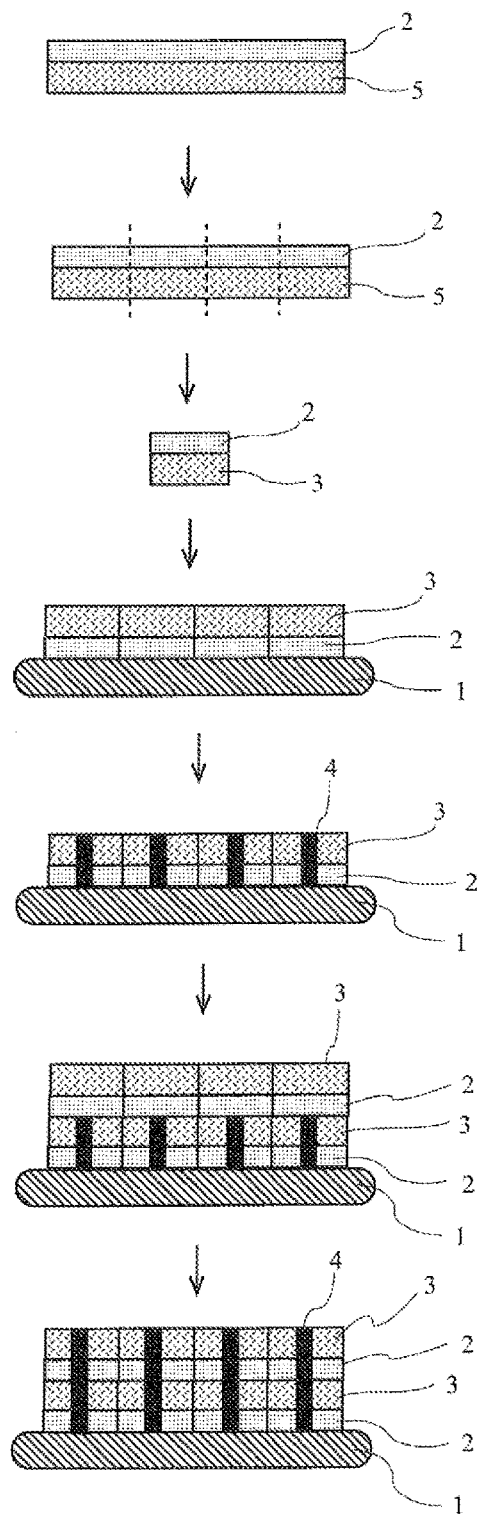
FIG. 2 schematically illustrates a method according to another embodiment of the present invention for producing a three-dimensional multilayer semiconductor, where the method uses the adhesive composition according to the present invention for multilayer semiconductors.

Non-limiting examples of the method for producing a three-dimensional multilayer semiconductor using the adhesive composition according to the present invention for multilayer semiconductors include methods illustrated in FIGS. 1 and 2. In the method illustrated in FIG. 1, an adhesive layer 2 is formed from the adhesive composition for multilayer semiconductors on the surface of a support 1. The adhesive layer 2 is applied to semiconductor chips 3 and cured. Through-silicon vias 4 are formed to form a first layer. By repeating a similar operation, a second layer and other layers may be formed. In the method illustrated in FIG. 2, an adhesive layer 2 is formed from the adhesive composition for multilayer semiconductors on the surface of a semiconductor wafer 5 to give a semiconductor wafer 5 with adhesive layer 2. The semiconductor wafer 5 with adhesive layer 2 is diced to give semiconductor chips 3 with adhesive layer 2. The semiconductor chips 3 with adhesive layer 2 are placed on a support 1 so that the adhesive layer side is in contact with the support 1. The adhesive layer is then cured, and through-silicon vias 4 are formed to give a first layer. Next, a similar operation is repeated to give a second layer and other layers.

EXAMPLES

The present invention will be illustrated in further detail with reference to several examples below. It should be noted, however, that the examples are by no means intended to limit the scope of the present invention.

The spin coating of adhesive compositions was performed using a spin coater (trade name ACT-400A II, supplied by ACTIVE Co., Ltd.).

The complex viscosity was measured using a rheometer (trade name MCR-302, supplied by Anton Paar GmbH).

The tensile strength was measured using a tensile/compression tester (trade name RTF-1350, supplied by ORIENTEC Co., Ltd.).

Example 1

There were used 450 g of 1,2-epoxy-4-(2-oxiranyl)cyclohexane adduct of 2,2-bis(hydroxymethyl)-1-butanol (softening point: 70° C. to 90° C., trade name EHPE3150, supplied by Daicel Corporation) and 50 g of (3,4,3',4'-diepoxy) bicyclohexyl (melting point: 0° C. or lower), both as polymerizable compounds; 10 g of a $PF_6^-$ sulfonium salt (trade name SI-150L, having a thermal curing time of 5.4 minutes at 130° C., supplied by SANSHIN CHEMICAL INDUSTRY CO., LTD.) as a cationic-polymerization initiator; 0.1 g of (4-hydroxyphenyl)dimethylsulfonium methylsulfate (Auxiliary for San-Aid SI Series, supplied by SANSHIN CHEMICAL INDUSTRY CO., LTD.) as a cationic-polymerization stabilizer; and 0.1 g of 3-glycidoxypropyltriethoxysilane (trade name KBE-403, supplied by Shin-Etsu Chemical Co., Ltd.) as a silane coupling agent. These were dissolved in 500 g of propylene glycol monomethyl ether acetate solvent and yielded an adhesive composition (1).

A silicon plate having a size of 2 cm by 5 cm was prepared by dicing a silicon wafer having a diameter of 100 mm (supplied by SUMCO Corporation). The above-prepared adhesive composition (1) was applied onto the silicon plate by spin coating, heated at 90° C. for 5 minutes, subsequently heated at 100° C. for 5 minutes, and yielded silicon plate with a 5-μm thick adhesive layer (1). At a temperature of 30° C. or lower, the adhesive layer (1) had approximately no adhesiveness to another silicon plate and to a glass plate and could be cut without adhesive deposition on a box cutter blade. The complex viscosity of the adhesive layer (1) was measured at 80° C. and found to be 0.31 Pa·s.

Immediately after the formation of the adhesive layer (1), a glass plate having a size of 2 cm by 5 cm was placed on the adhesive layer (1) side of the silicon plate with adhesive layer (1) so as to overlap in an area of 4 cm$^2$. The resulting article was compressed at 600 Kgf/m$^2$ and 80° C. in a reduced-pressure atmosphere for 5 minutes. This allowed the adhesive layer (1) to soften and to adhere to the adherend. The resulting article was heated, under normal atmospheric pressure, at 150° C. for 30 minutes and subsequently at 170° C. for 30 minutes and yielded a bonded assembly (1).

The bonded assembly (1) was examined by DSC and found to have a degree of cure of the adhesive layer (1) of 99.8%.

The bonded assembly (1) was subjected to tensile strength measurement and found to undergo not delamination at the adhesive face, but silicon plate failure due to tension.

In addition, another sample of the silicon plate with adhesive layer (1) was left stand at an ambient temperature of 25° C. and relative humidity of 60% for 30 days after the preparation. Even this sample successfully adhered to the adherend to give a bonded assembly. The bonded assembly was subjected to tensile strength measurement and found to undergo not delamination at the adhesive face, but silicon plate failure due to tension.

Example 2

An adhesive composition (2) was prepared by a procedure similar to Example 1, except for using, as polymerizable compounds, 450 g of EHPE3150, 25 g of (3,4,3',4'-diepoxy) bicyclohexyl, and 25 g of 1,4-bis[(3-ethyl-3-oxetanyl-methoxy)methyl]benzene (melting point: 41° C., trade name OXT121, supplied by Toagosei Co., Ltd.).

Except for using the prepared adhesive composition (2), a silicon plate with adhesive layer (2) was prepared by a procedure similar to Example 1.

At a temperature of 30° C. or lower, the adhesive layer (2) had approximately no adhesiveness to another silicon plate and to a glass plate and could be cut without adhesive deposition on a box cutter blade. The adhesive layer (2) was found to have a complex viscosity of 0.21 Pa·s at 80° C.

Immediately after the formation of the adhesive layer (2), a glass plate was placed on the silicon plate with the adhesive layer (2) and was compressed at 600 Kgf/m$^2$ at 80° C. in a reduced-pressure atmosphere for 5 minutes, by a procedure similar to Example 1. This allowed the adhesive layer (2) to soften and to adhere to the adherend. The resulting article was heated, under normal atmospheric pressure, at 150° C. for 30 minutes and at 170° C. for 30 minutes and yielded a bonded assembly (2).

The degree of cure of the adhesive layer (2) in the bonded assembly (2) was measured by DSC and found to be 99.4%.

The bonded assembly (2) was subjected to tensile strength measurement and found to undergo not delamination at the adhesive face, but silicon plate failure due to tension.

In addition, another sample of the silicon plate with adhesive layer (2) was left stand at an ambient temperature of 25° C. and relative humidity of 60% for 30 days after the preparation. Even this sample successfully adhered to the glass plate to give a bonded assembly. The bonded assembly was subjected to tensile strength measurement and found to undergo not delamination at the adhesive face, but silicon plate failure due to tension.

Example 3

An adhesive composition (3) was prepared by a procedure similar to Example 1, except for not using the Auxiliary for San-Aid SI Series as the cationic-polymerization stabilizer.

Except for using the prepared adhesive composition (3), a silicon plate with adhesive layer (3) was prepared by a procedure similar to Example 1.

At a temperature of 30° C. or lower, the adhesive layer (3) had approximately no adhesiveness to another silicon plate and to a glass plate and could be cut without adhesive deposition on a box cutter blade. The adhesive layer (3) was found to have a complex viscosity of 0.25 Pa·s at 80° C.

Immediately after the formation of the adhesive layer (3), a glass plate was placed on the silicon plate with adhesive layer (3) and compressed at 600 Kgf/m$^2$ at 80° C. in a reduced-pressure atmosphere for 5 minutes, by a procedure similar to Example 1. This allowed the adhesive layer (3) to soften and to adhere to the adherend. The resulting article was heated, under normal atmospheric pressure, at 150° C. for 30 minutes and at 170° C. for 30 minutes and yielded a bonded assembly (3).

The degree of cure of the adhesive layer (3) in the bonded assembly (3) was measured by DSC and found to be 97.0%.

The bonded assembly (3) was subjected to tensile strength measurement and found to undergo not delamination at the adhesive face, but silicon plate failure due to tension.

In addition, another sample of the silicon plate with adhesive layer (3) was left stand at an ambient temperature of 25° C. and relative humidity of 60% for 7 days after the preparation. This sample was placed on a glass plate and compressed at 600 Kgf/m$^2$ at 80° C. in a reduced-pressure atmosphere for 5 minutes. However, the adhesive layer (3) failed to soften and to adhere to the adherend. The degree of cure of the adhesive layer (3) in this sample was measured by DSC and found to be 40.4%.

Example 4

There were used 450 g of EHPE3150, 50 g of 3,4-epoxycyclohexylmethyl (3,4-epoxy)cyclohexanecarboxylate (melting point: 0° C. or lower, trade name CELLOXIDE 2021P, supplied by Daicel Corporation), and 17.5 g of triglycidyl isocyanurate (melting point: 108° C., reagent supplied by Tokyo Chemical Industry Co., Ltd.), all serving as polymerizable compounds; 10 g of a PF$_6^-$ sulfonium salt (trade name SI-150L, having a thermal curing time of 5.4 minutes at 130° C., supplied by SANSHIN CHEMICAL INDUSTRY CO., LTD.), serving as a cationic-polymerization initiator; and 0.1 g of (4-hydroxyphenyl)dimethylsulfonium methylsulfate (Auxiliary for San-Aid SI Series, supplied by SANSHIN CHEMICAL INDUSTRY CO., LTD.), serving as a cationic-polymerization stabilizer. These were dissolved in 500 g of propylene glycol monomethyl ether acetate solvent and yielded an adhesive composition (4).

A silicon plate having a size of 2 cm by 5 cm was prepared by dicing a silicon wafer having a diameter of 100 mm (supplied by SUMCO Corporation). The above-prepared adhesive composition (4) was applied onto the silicon plate by spin coating, heated at 100° C. for 2 minutes, subsequently at 120° C. for 2 minutes, and yielded a silicon plate with a 5-μm thick adhesive layer (4). At a temperature of 30° C. or lower, the adhesive layer (4) had approximately no adhesiveness to another silicon plate and to a glass plate and could be cut without adhesive deposition on a box cutter blade. The complex viscosity of the adhesive layer (4) was measured at 80° C. and found to be 0.28 Pa·s.

Immediately after the formation of the adhesive layer (4), a glass plate having a size of 2 cm by 5 cm was placed on the adhesive layer (4) side of the silicon plate with adhesive layer (4) so as to overlap in an area of 4 cm$^2$. The resulting article was compressed at 600 Kgf/m$^2$ at 60° C. in a reduced-pressure atmosphere for 5 minutes. This allowed the adhesive layer (4) to soften and to adhere to the adherend. The resulting article was heated, under normal atmospheric pressure, at 150° C. for 30 minutes and at 170° C. for 30 minutes and yielded a bonded assembly (4).

The degree of cure of the adhesive layer (4) in the bonded assembly (4) was measured by DSC and found to be 99.9%.

The bonded assembly (4) was subjected to tensile strength measurement and found to undergo not delamination at the adhesive face, but silicon plate failure due to tension.

In addition, another sample of the silicon plate with adhesive layer (4) was left stand at an ambient temperature of 25° C. and relative humidity of 60% for 30 days after the preparation. Even this sample successfully adhered to the glass plate to give a bonded assembly. The bonded assembly was subjected to tensile strength measurement and found to undergo not delamination at the adhesive face, but silicon plate failure due to tension.

Example 5

There were used 100 g of EHPE3150 and 3.5 g of triglycidyl isocyanurate (melting point: 108° C., reagent supplied by Tokyo Chemical Industry Co., Ltd.), both serving as polymerizable compounds; and 1.5 g of 1-cyanoethyl-2-methylimidazole (having a thermal curing time of 3.5 minutes or longer at 130° C.), serving as an anionic-polymerization initiator. These were dissolved in 100 g of propylene glycol monomethyl ether acetate solvent and yielded an adhesive composition (5).

A silicon plate having a size of 2 cm by 5 cm was prepared by dicing a silicon wafer having a diameter of 100 mm (supplied by SUMCO Corporation). The silicon plate was coated on one side with a silane coupling agent (trade name KBE403, supplied by Shin-Etsu Chemical Co., Ltd.) by spin coating, heated at 100° C. for 15 minutes, further coated with the above-prepared adhesive composition (5) by spin coating, heated at 80° C. for 2 minutes and subsequently at 100° C. for 2 minutes to form a 5-μm thick adhesive layer (5), and yielded a silicon plate with adhesive layer (5). This had a layer configuration including the silicon plate, the silane coupling agent layer, and the adhesive layer disposed in this order. At a temperature of 30° C. or lower, the formed adhesive layer (5) had approximately no adhesiveness to another silicon plate and to a glass plate and could be cut without adhesive deposition on a box cutter blade.

A glass plate having a size of 2 cm by 5 cm) was coated on one side with a silane coupling agent (trade name KBE403, supplied by Shin-Etsu Chemical Co., Ltd.) by spin coating, heated at 100° C. for 15 minutes to form a silane coupling agent layer, and yielded a glass plate with silane coupling agent layer. This had a layer configuration including the glass plate and the silane coupling agent layer disposed in this order.

Immediately after the formation of the adhesive layer (5), the glass plate with the silane coupling agent layer was placed on the adhesive layer (5) side of the silicon plate with adhesive layer (5) so as to overlap in an area of 4 cm$^2$, and compressed at 600 Kgf/m$^2$ at 60° C. in a reduced-pressure atmosphere for 5 minutes. This allowed the adhesive layer (5) to soften and to adhere to the adherend. The resulting article was heated, under normal atmospheric pressure, at 150° C. for 30 minutes and at 170° C. for 30 minutes and yielded a bonded assembly (5).

The degree of cure of the adhesive layer (5) in the bonded assembly (5) was measured by DSC and found to be 90% or more. A razor blade was inserted into the adhesive interface of the bonded assembly (5), but this did not cause delamination at the adhesive face, demonstrating that the sample had excellent adhesiveness.

Example 6

There were used 100 g of EHPE3150 and 3.5 g of triglycidyl isocyanurate (melting point: 108° C., reagent supplied by Tokyo Chemical Industry Co., Ltd.), both serving as polymerizable compounds; and 1.5 g of 1-cyanoethyl-2-undecylimidazole (having a thermal curing time of 3.5 minutes or longer at 130° C.), serving as an anionic-polymerization initiator. These were dissolved in 100 g of propylene glycol monomethyl ether acetate solvent and yielded an adhesive composition (6).

A silicon plate having a size of 2 cm by 5 cm was prepared by dicing a silicon wafer having a diameter of 100 mm (supplied by SUMCO Corporation). The silicon plate was coated on one side with a silane coupling agent (trade name KBE403, supplied by Shin-Etsu Chemical Co., Ltd.) by spin coating, heated at 100° C. for 15 minutes, further coated with the above-prepared adhesive composition (6) by spin coating, heated at 80° C. for 2 minutes and subsequently at 100° C. for 2 minutes to form a 5-μm thick adhesive layer (6), and yielded a silicon plate with adhesive layer (6). This had a layer configuration including the silicon plate, the silane coupling agent layer, and the adhesive layer disposed in this order. At a temperature of 30° C. or lower, the formed adhesive layer (6) had approximately no adhesiveness to another silicon plate and to a glass plate and could be cut without adhesive deposition on a box cutter blade.

Immediately after the formation of the adhesive layer (6), a glass plate with silane coupling agent layer prepared by a procedure similar to Example 5 was placed on the adhesive layer (6) side of the silicon plate with adhesive layer (6) so as to overlap in an area of 4 cm$^2$. The resulting article was compressed at 600 Kgf/m$^2$ at 60° C. in a reduced-pressure atmosphere for 5 minutes. This allowed the adhesive layer (6) to soften and to adhere to the adherend. The resulting article was heated, under normal atmospheric pressure, at 150° C. for 30 minutes and at 170° C. for 30 minutes and yielded a bonded assembly (6).

The degree of cure of the adhesive layer (6) in the bonded assembly (6) was measured by DSC and found to be 90% or more. A razor blade was inserted into the adhesive interface of the bonded assembly (6), but this did not cause delamination at the adhesive face, demonstrating that the sample had excellent adhesiveness.

Comparative Example 1

An adhesive composition (7) was prepared by a procedure similar to Example 1, except for using a SbF$_6^-$ arylsulfonium salt (trade name SI-100L, having a thermal curing time of shorter than 1 minute at 130° C., supplied by SANSHIN CHEMICAL INDUSTRY CO., LTD.) as a cationic-polymerization initiator instead of the trade name SI-150L; and not using the Auxiliary for San-Aid SI Series, serving as a cationic-polymerization stabilizer.

Except for using the prepared adhesive composition (7), a silicon plate with adhesive layer (7) was prepared by a procedure similar to Example 1.

At a temperature of 30° C. or lower, the adhesive layer (7) had approximately no adhesiveness to another silicon plate and to a glass plate and could be cut without adhesive deposition on a box cutter blade.

Immediately after the formation of the adhesive layer (7), a glass plate was placed on the adhesive layer (7), and the resulting article was compressed at 600 Kgf/m$^2$ at 80° C. in a reduced-pressure atmosphere for 5 minutes, by a procedure similar to Example 1. However, this failed to cause the adhesive layer (7) to soften and to adhere to the adherend. The degree of cure of the adhesive layer (7) in this stage was measured by DSC and found to be 29.8%.

INDUSTRIAL APPLICABILITY

The adhesive composition according to the present invention for multilayer semiconductors, when applied to an article, such as a semiconductor wafer or a support, and heated, can be rapidly dried and form an adhesive layer that less undergoes curing progress.

At temperatures of lower than 50° C., the adhesive layer is solid, has approximately no adhesiveness (or tackiness), and, even when subjected typically to dicing, can be easily cut without adhesive deposition on a cutting blade.

In addition, the adhesive layer less undergoes from polymerization progress and therefore has excellent storage stability.

The adhesive layer can offer appropriate adhesiveness when heated at such a temperature as to be 50° C. or higher and not to cause damage typically to the semiconductor wafer or semiconductor chip at a timing when adhesiveness is desired. This allows bonding without semiconductor chip failure.

After the semiconductor chip bonding, the adhesive layer is heated at such a temperature as not to cause damage typically to the semiconductor wafer and the semiconductor chip. This allows the adhesive layer to be cured rapidly to form a cured product that has excellent heat resistance and maintains firm bonding of the semiconductor chip typically with the support.

Accordingly, the adhesive composition according to the present invention for multilayer semiconductors is advantageously usable in the production of three-dimensional multilayer semiconductors.

REFERENCE SIGNS LIST 1 support
2 adhesive layer derived from adhesive composition according to the present invention for multilayer semiconductors
3 semiconductor chip
4 through-silicon via
5 semiconductor wafer

The invention claimed is:
1. An adhesive composition for multilayer semiconductors, the adhesive composition comprising:
a polymerizable compound (A);
a polymerization initiator (B) comprising at least one polymerization initiator selected from a cationic-polymerization initiator (B1) and an anionic-polymerization initiator (B2); and
a solvent (C),
the polymerizable compound (A) comprising an epoxide having a softening point or melting point (in conformity with JIS K 0064:1992) of 50° C. or higher in an amount of 80% by weight or more of a total amount of the polymerizable compound,
the cationic-polymerization initiator (B1) giving a composition having a thermal curing time (in conformity with JIS K 5909:1994) of 3.5 minutes or longer at 130° C., the composition containing 1 part by weight of the cationic-polymerization initiator (B1) and 100 parts by weight of 3,4-epoxycyclohexylmethyl (3,4-epoxy)cyclohexanecarboxylate,
the anionic-polymerization initiator (B2) giving a composition having a thermal curing time (in conformity with JIS K 5909:1994) of 3.5 minutes or longer at 130° C., the composition containing 1 part by weight of the anionic-polymerization initiator (B2) and 100 parts by weight of bisphenol-A diglycidyl ether.

2. The adhesive composition according to claim 1 for multilayer semiconductors, wherein the polymerizable compound (A) comprises a compound represented by Formula (1-1):

[Chem. 1]

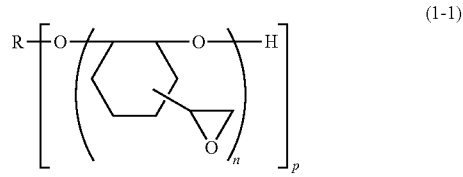

(1-1)

wherein R represents a straight or branched chain saturated aliphatic hydrocarbon group containing 6 or more carbon atoms; n represents, independently in each occurrence, an integer of 1 to 30; and p represents an integer of 1 to 6.

3. The adhesive composition according to claim 2 for multilayer semiconductors,
wherein the polymerizable compound (A) further comprises a compound represented by Formula (7-1):

[Chem. 2]

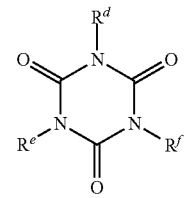

(7-1)

wherein $R^d$, $R^e$, and $R^f$ are each, identically or differently, selected from a hydrogen atom and an organic group optionally containing an oxirane ring structure or a hydroxy group, where at least one of $R^d$, $R^e$, and $R^f$ is an organic group containing an oxirane ring structure.

4. The adhesive composition according to claim 3 for multilayer semiconductors,
wherein the organic group containing an oxirane ring structure is a glycidyl group.

5. The adhesive composition according to claim 3 for multilayer semiconductors,
wherein the compound represented by Formula (7-1) is triglycidyl isocyanurate.

6. The adhesive composition according to claim 1 for multilayer semiconductors,
wherein the adhesive composition comprises the cationic-polymerization initiator (B1) as the polymerization initiator (B), and
wherein the adhesive composition further comprises a cationic-polymerization stabilizer (D) in an amount of 0.1% by weight or more relative to the cationic-polymerization initiator (B1).

7. The adhesive composition according to claim 1 for multilayer semiconductors, the adhesive composition further comprising
a silane coupling agent (E).

8. An adhesive sheet for multilayer semiconductors, the adhesive sheet prepared by applying and drying the adhesive composition according to claim 1 for multilayer semiconductors.

9. A semiconductor wafer with adhesive layer, structurally comprising:

a semiconductor wafer; and an adhesive layer disposed on or over the semiconductor wafer, the adhesive layer derived from the adhesive composition according to claim 1 for multilayer semiconductors.

10. A semiconductor chip with adhesive layer, structurally comprising:

a semiconductor chip; and an adhesive layer disposed on or over the semiconductor chip, the adhesive layer derived from the adhesive composition according to claim 1 for multilayer semiconductors.

11. A method for producing a three-dimensional multilayer semiconductor, the method comprising stacking semiconductors using the adhesive composition according to claim 1 for multilayer semiconductors.

12. The adhesive composition according to claim 2 for multilayer semiconductors, wherein the adhesive composition comprises the cationic-polymerization initiator (B1) as the polymerization initiator (B), and wherein the adhesive composition further comprises a cationic-polymerization stabilizer (D) in an amount of 0.1% by weight or more relative to the cationic-polymerization initiator (B1).

13. The adhesive composition according to claim 3 for multilayer semiconductors, wherein the adhesive composition comprises the cationic-polymerization initiator (B1) as the polymerization initiator (B), and wherein the adhesive composition further comprises a cationic-polymerization stabilizer (D) in an amount of 0.1% by weight or more relative to the cationic-polymerization initiator (B1).

14. The adhesive composition according to claim 4 for multilayer semiconductors, wherein the adhesive composition comprises the cationic-polymerization initiator (B1) as the polymerization initiator (B), and wherein the adhesive composition further comprises a cationic-polymerization stabilizer (D) in an amount of 0.1% by weight or more relative to the cationic-polymerization initiator (B1).

15. The adhesive composition according to claim 5 for multilayer semiconductors, wherein the adhesive composition comprises the cationic-polymerization initiator (B1) as the polymerization initiator (B), and wherein the adhesive composition further comprises a cationic-polymerization stabilizer (D) in an amount of 0.1% by weight or more relative to the cationic-polymerization initiator (B1).

16. The adhesive composition according to claim 2 for multilayer semiconductors, the adhesive composition further comprising a silane coupling agent (E).

17. The adhesive composition according to claim 3 for multilayer semiconductors, the adhesive composition further comprising a silane coupling agent (E).

18. The adhesive composition according to claim 4 for multilayer semiconductors, the adhesive composition further comprising a silane coupling agent (E).

19. The adhesive composition according to claim 5 for multilayer semiconductors, the adhesive composition further comprising a silane coupling agent (E).

20. The adhesive composition according to claim 6 for multilayer semiconductors, the adhesive composition further comprising a silane coupling agent (E).

* * * * *